(12) United States Patent
Arakawa et al.

(10) Patent No.: US 6,385,088 B1
(45) Date of Patent: *May 7, 2002

(54) NON-VOLATILE MEMORY DEVICE

(75) Inventors: Hideki Arakawa; Akira Tanaka; Kenshiro Arase; Masaru Miyashita, all of Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/599,857

(22) Filed: Feb. 13, 1996

Related U.S. Application Data

(63) Continuation of application No. 08/219,534, filed on Mar. 29, 1994, now abandoned.

(30) Foreign Application Priority Data

| | | |
|---|---|---|
| Mar. 31, 1993 | (JP) | 5-074769 |
| Sep. 29, 1993 | (JP) | 5-243069 |
| Nov. 29, 1993 | (JP) | 5-297903 |

(51) Int. Cl.[7] .............................................. G11C 16/04
(52) U.S. Cl. ............................. 365/185.16; 365/185.13
(58) Field of Search ................................. 365/104, 185, 365/900, 230.06, 185.16, 185.13

(56) References Cited

U.S. PATENT DOCUMENTS

| | | | | | |
|---|---|---|---|---|---|
| 5,023,837 | A | * | 6/1991 | Schreck et al. | 365/185 |
| 5,117,389 | A | * | 5/1992 | Yiu | 365/104 |
| 5,197,029 | A | * | 3/1993 | Schreck et al. | 365/185 |
| 5,280,442 | A | * | 1/1994 | Hotta | 365/63 |
| 5,295,096 | A | * | 3/1994 | Nakajima | 365/218 |
| 5,305,252 | A | * | 4/1994 | Saeki | 365/63 |
| 5,319,593 | A | * | 6/1994 | Wolstenholme | 365/185 |
| 5,327,378 | A | * | 7/1994 | Kazerounian | 365/900 |
| 5,332,917 | A | * | 7/1994 | Lee et al. | 365/104 |
| 5,369,608 | A | * | 11/1994 | Lim et al. | 365/185 |
| 5,371,697 | A | * | 12/1994 | Yamada | 365/185 |

FOREIGN PATENT DOCUMENTS

| | | | |
|---|---|---|---|
| JP | 6-104406 | * | 4/1994 |

* cited by examiner

Primary Examiner—A. Zarabian
(74) Attorney, Agent, or Firm—Sonnenschein, Nath & Rosenthal

(57) ABSTRACT

A non-volatile memory device including a plurality of block, each including: a main bit line; a plurality of sub-bit lines to which memory transistors are connected and which are arranged in parallel with respect to the main bit line; and two cascade-connected selection gates which are provided between the main bit line and sub-bit lines and which selectively connect the sub-bit lines.

5 Claims, 28 Drawing Sheets

FIG. 5

| | ENERGISED /SEL-GATE | DEENERGISED /SEL-GATE | ENERGISED /WORD-LINE | DEENERGISED /WORD-LINE | ENERGISED /MAIN BIT-LINE | DEENERGISED /MAIN BIT-LINE | SOURCE LINE |
|---|---|---|---|---|---|---|---|
| READING | 3v | 0v | 3.5v | 0v | 1v | 0v | 0v |
| ERASING | 0v | 0v | 20v | 0v | 0v | 0v | 0v |
| WRITING | 7v | 0v | −12v | 0v | 5v/0v | — | 0v |

FIG. 6

|  | DRAIN | | GATE | | SOURCE |
|---|---|---|---|---|---|
|  | SELECTED | NON-SELECTED | SELECTED | NON-SELECTED | |
| READING | 1v | Open | 3.5v | 0v | 0v |
| ERASING | 0v | Open | 20v | 0v | 0v |
| WRITING | 5v/0v | Open | −12v | 0v | 0v |

FIG. 7

| | READING | ERASING | WRITING | |
|---|---|---|---|---|
| VOLTAGE CONDITION | G 3.5v, FG, S, 1v D | G 20v, 0v FG, S, 0v D | G 0v FG, S, −12v, 5v D | G 0v FG, S, −12v, 0v D |
| FLOATING GATE (FG) CONDITION | ELECTRONS FULLY DISCHARGED STATE | ELECTRONS INJECTION STATE | BROUGHT INTO ELECTRON INJECTION STATE | CHANGED TO ELECTRON INJECTION STATE FROM FULLY DISCHARGED STATE | KEPT ELECTRON INJECTION STATE |
| RESULTANT PHENOMENA | FLOW CELL CURRENT | DO NOT FLOW CELL CURRENT | ELECTRONS' TUNNELING FROM SUBSTRATE S/D TO FG | ELECTRONS' TUNNELING FROM FG TO DRAIN (D) | NOT OCCURED TUNNELING FROM FG TO D (BECAUSE OF WEAK ELECTRIC FIELD) |

$P_{WL}$ $P_{BL1}$ $P_{BL2}$

•
•

$P_{BLN}$

FIG. 9A $P_{WL}$

FIG. 9B $P_{BLG1}$

FIG. 9C $P_{BLG2}$

FIG. 9D $P_{BLG3}$

•
•

FIG. 9E $P_{BLGN}$

FIG. 15A

| | READING | | | | ERASING | | WRITING | | |
|---|---|---|---|---|---|---|---|---|---|
| | SELECTED | MDd: SELECTED Ajd: NON-SELECTED | MDd: NON-SELECTED Ajd: SELECTED | NON-SELECTED | SELECTED | NON-SELECTED | SELECTED | MDd: SELECTED Ajd: NON-SELECTED | MDd: NON-SELECTED Ajd: SELECTED | NON-SELECTED |
| MDd | 3.0V | 3.0 | 0.0 | 0.0 | 20V (Fig.15C) | 0V | 5V | 5V | −12V | −12V |
| Ajd | 3.5 | 0.0 | 3.5 | 0.0 | 20V (Fig.15C) | 20V | −12V | 0V | 0V | 0V |
| TwLd | 3.0 | 3.0 | 3.0 | 3.0 | 20V | 20V | 3V | 3V | 3V | 3V |
| WLjd | 3.5 | 3.5 | 0.0 | 0.0 | 20V | 0V | −12V | 0V | 0V | 0V |

FIG. 15B

| | READING | | | | ERASING | | WRITING | | |
|---|---|---|---|---|---|---|---|---|---|
| | SELECTED | MDd: SELECTED Ajd: NON-SELECTED | MDd: NON-SELECTED Ajd: SELECTED | NON-SELECTED | SELECTED | NON-SELECTED | SELECTED | MDd: SELECTED Ajd: NON-SELECTED | MDd: NON-SELECTED Ajd: SELECTED | NON-SELECTED |
| ASjd | 3.0V | 0.0 | 3.0 | 0.0 | 0V | 0V | 7V | 0V | 5V | 0V |
| TSGd | 3.0V | 3.0 | 3.0 | 3.0 | 3V | 3V | 5V | 5V | 5V | 5V |
| SGid | 3.0V | 0.0 | 0.0 | 0.0 | 0V | 0V | 7V | 0V | 0V | 0V |
| Well | 0.0 | 0.0 | 0.0 | 0.0 | 0V | 0V | −12V | −12V | −12V | −12V |

FIG. 15C

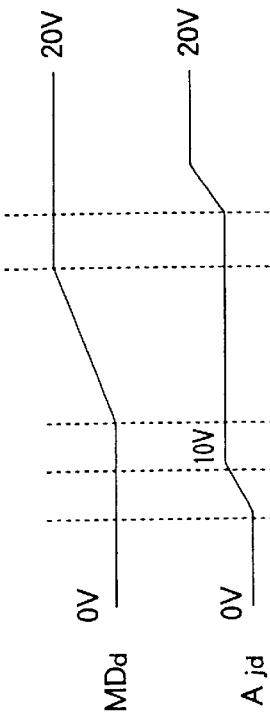

RAISING WAVE FORMS OF MDd AND Ajd

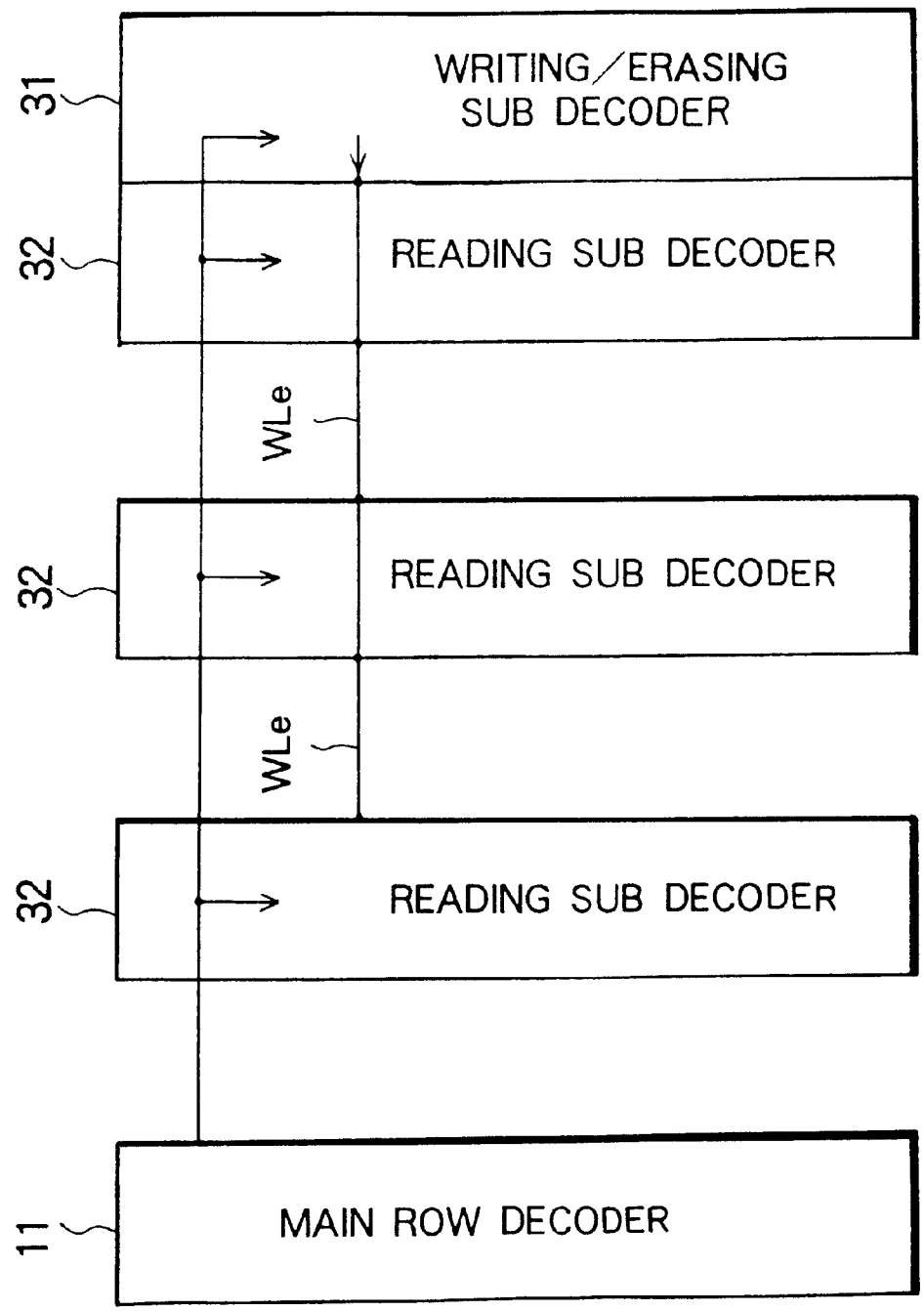

FIG. 19

| | READING | | | | ERASING | | WRITING | | | |
|---|---|---|---|---|---|---|---|---|---|---|
| | MDf: SELECTED Add: SELECTED | MDf: SELECTED Add: NON-SELECTED | MDf: NON-SELECTED Add: SELECTED | NON-SELECTED | SELECTED | NON-SELECTED | MDf: SELECTED Add: SELECTED | MDf: SELECTED Add: NON-SELECTED | MDf: NON-SELECTED Add: SELECTED | NON-SELECTED |
| MDf | 3.5 V | 3.5 V | 0 V | 0 V | 3 V | 0 V | 3 V | 3 V | 0 V | 0 V |
| ABWJf | 0 V | 0 V | 0 V | 0 V | 22 V | 22 V | 3 V | -12 V | 3 V | -12 V |
| ABWJf_ | 0 V | 0 V | 0 V | 0 V | 0 V | 0 V | -12 V | 3 V | -12 V | 3 V |
| ARJf | 3 V | 3 V | 3 V | 0 V | 0 V | 0 V | -12 V | -12 V | -12 V | -12 V |
| ARJf_ | 0 V | 0 V | 0 V | 3 V | 0 V | 0 V | -12 V | -12 V | -12 V | -12 V |
| VB | 3 V | | | | 3V→22V | | 3V→0V | | | |
| VW | 0 V | | | | 0 V | | 0V→-12V | | | |
| VSEW | 3 V | 3 V | 3 V | 0 V | 3V→-22V | 0 V | -12 V | -12 V | 0 V | 0 V |
| VLJf | 3.5 V | 0 V | 0 V | 0 V | 3V→-20V | 0 V | -12 V | 0 V | 0 V | 0 V |

FIG. 21

|        | DATA "1" WRITE | DATA "0" WRITE |
|--------|----------------|----------------|
| MILb   | 5~6V           | 0V             |
| SGLb1  | 10V            | 10V            |
| SGLb2  | 0V             | 0V             |
| SGLb1b | 10V            | 10V            |
| SGLb2b | 0V             | 0V             |
| WLb    | −10V           | −10V           |
| SRLb   | FLOATING STATE | FLOATING STATE |

FIG. 28

| MODES | | SIGNALS | BLj | BLj | WLk | SGk | WL1 | SG1 | SL | Well |
|---|---|---|---|---|---|---|---|---|---|---|---|
| ERASE → WLk SELECT | VOLTAGE | | OPEN | OPEN | 15V | 15V | −6V | 0V | −6V | −6V |
| | M1 | | ELECTRONS ARE INJECTED FROM WELL TO FG, AND Vth BECOMES HIGH ||||||||
| | M2 | |||||||||
| | M3 | | NOT CHANGED ||||||||
| | M4 | |||||||||
| WRITE M1: WRITE M2: NOT-WRITE | VOLTAGE | | 5V | 0V | −13V | −13V | 4V | 0V | 0V | 0V |
| | M1 | | ELECTRONS ARE INJECTED FROM FG TO DAIN, AND Vth BECOMES LOW ||||||||
| | M2 | | SUBSTANTIALLY NOT CHANGED ||||||||
| | M3 | | NOT CHANGED ||||||||
| | M4 | |||||||||
| READ → M1 | VOLTAGE | | 1V | OPEN | 3V | 3V | 0V | 0V | 0V | 0V |
| | M1 | | WRITTEN CELL : ENABLING FLOW OF CURRENT  NOT WRITTEN CELL : NOT ENABLING FLOW OF CURRENT ||||||||
| | M2 | | BLj IS NOT CONNECTED TO S/A ||||||||
| | M3 | | WHEN GATE VOLTAGE = 0V → CURRENT DOES NOT FLOW ||||||||
| | M4 | |||||||||

NON-VOLATILE MEMORY DEVICE

This is a continuation of application Ser. No. 08/219,534 filed Mar. 29, 1994 now abandoned.

BACKGROUND OF THE INVENTION

1. Field of the Invention

The present invention relates to an electrically rewritable non-volatile memory, for example, a semiconductor non-volatile memory device such as a flash EEPROM, and to a decoder circuit thereof.

2. Description of the Related Art

In recent years, flash memories have been the subject of vigorous development. The mainstream of development has been the hot electron/Fowler-Nordheim (FN) tunnel injection phenomenon wherein channel hot electrons are injected into a floating gate at the time of writing and the electrons are discharged from the floating gate to a source at the time of erasing by the FN tunneling.

More specifically, at the time of writing, 12V is applied to a control gate, 5 to 7V is applied to a drain, 0V is applied to a source and a substrate, and the hot electrons generated in the channel are injected into the floating gate, whereby data is written.

At the time of erasing, 0V or a negative voltage of from –9 to –12V is applied to the control gate, a positive voltage of 12V or 5V is applied to the source, 0V is applied to the substrate, and the drain is kept at the floating state, to thereby discharge the electrons from the floating gate to source by the FN tunneling, whereby data is erased.

However, this hot electron/FN tunnel injection method has a problem in that it is difficult to lower the voltage, the channel current required for the writing is large and therefore the booster circuit becomes big, etc.

In a NOR type flash memory, the lowering of voltage is the biggest issue.

In the past, there has been proposed a NOR type flash memory which solves these problems, has the feature of enabling NOR type random access, and, further, incorporates the merits of NAND type performance, i.e., a high writing speed (refer to, for example, NIKKEI MICRODEVICES pp. 66–67, October 1992).

FIG. 1 is a view of the arrangement and configuration of a so-called NOR type flash memory proposed in the past.

In FIG. 1, $MIL_a$ denotes a main bit line; $SBL_a$ denotes a sub-bit line; $SRL_a$ denotes a source line, $ST_a$ a selection transistor serving as a selection gate; $SGL_a$, a selection gate line, $MT_{a0}$ to $MT_{a3}$ denote memory transistors; and $WL_{a0}$ to $WL_{a3}$ denote word lines; respectively.

In this memory cell, as shown in FIG. 1, the sub-bit lines SBL are branched from the main bit line $MIL_a$, and a plurality of memory transistors (four in this example) are arranged in parallel at each branched sub-bit line SBL via the selection transistors ST.

FIGS. 2A and 2B are views of an example of an actual construction of the flash memory of FIG. 1, in which FIG. 2A is a plan view of the principal part of the memory cell of FIG. 1; and FIG. 2B is a cross-sectional view taken along a line A—A in FIG. 2A.

In the present construction, a third layer of polycrystalline silicon (3-POLY) is used for the sub-bit lines SBL, and a first layer of aluminum (1-Al) is used for the main bit lines MIL (refer to the above-described document).

In this way, in the above-mentioned flash memory, 3-POLY is used as the material of the sub-bit lines SBL, and therefore the resistance thereof becomes about 200 times as large as that of aluminum.

Accordingly, the conventional flash memory is effective when thinking only of the cell size, but where the improvement of the accessing time etc. are taken into account, desirably aluminum with its low resistivity is used for the sub-bit lines SBL.

When adopting such a construction, to suppress the delay of the word lines WL, it becomes indispensable to use 1-Al for the sub-bit lines SBL and to use a second layer of aluminum (2-Al) for the main bit lines.

However, in the conventional memory arrangement of FIGS. 2A and 2B mentioned above, the arrangement of the memory cells is determined by the 2-Al having the widest line width and line pitch, and there is a problem in that the memory cells cannot be arranged on the chip with high efficiency.

Describing this problem in further detail, the pitch of the word lines WL of the flash memory is small, and therefore it is impossible to lay the word lines in a one-to-one correspondence(relationship) at the 2-Al. Accordingly, the only system which can be used is that of a main row decoder and sub-row decoder.

For this reason, in the case of a memory cell having the construction of FIGS. 2A and 2B, the number of masks and number of manufacturing steps in the production process are increased in comparison with the system using 1-Al.

Also, in the construction of FIG. 2, when assuming 1-Al is used for the sub-bit lines and 2-Al is used for the main bit lines, the step difference of the contact of 2-Al and the diffusion layer becomes very large, and it is extremely difficult to arrange direct contact between the 2-Al and the diffusion layer, so a technique of for example burying with tungsten becomes necessary.

Also, it is clear that neither of the layers 1-Al and 2-Al can be formed in the word line direction. When it is intended to form the layer 1-Al in the word line direction, the size in the vertical direction must be slightly sacrificed.

Further, when assuming that the main bit lines are formed at 2-Al, generally the pitch at the 2-Al becomes larger than the pitch of the 1-Al even if use is made of the technique of burying with tungsten, and therefore there is a large possibility of inducing an increase of the size of the cell in the lateral direction.

From the above, in the construction of FIG. 1 and FIGS. 2A and 2B, it is not possible to replace the 3-POLY by 1-Al and the 1-Al by 2-Al, an improvement of the accessing time cannot be achieved, and also the production process cannot be simplified.

Moreover, also a method of using the diffusion layer for the sub-bit lines has been proposed, but the resistance of the diffusion layer is about 2000 times as large as that of aluminum, and thus it is not suitable for the enhancement of speed.

Also, in this method, there are many problems such as realization of a quality of an oxide film on the diffusion layer into which an impurity is added at a high density, a short channel length, a large coupling ratio (ratio of control gate-floating gate capacitance with respect to the whole), etc., and thus this is not yet practical.

SUMMARY OF THE INVENTION

An object of the present invention is to provide a semiconductor non-volatile memory device operable by low voltage.

Another object of the present invention is to provide a semiconductor non-volatile memory device which can be improved in operation speed such as accessing time.

Still another object the present invention is to provide a semiconductor non-volatile memory device which can be produced by a simplified process.

Yet another object the present invention to provide a semiconductor non-volatile memory device which can be produced at a low cost.

Still another object the present invention is to provide a semiconductor non-volatile memory device which can prevent a malfunction, such as a non-intended write operation.

Another object of the present invention is to provide a decoder circuit which can be improved in operation speed.

According to the present invention, there is provided a semiconductor non-volatile memory device including one or more memory blocks, each memory block comprising:

a main bit line, a plurality of sub-bit lines connected to memory transistors and arranged in parallel with respect to the main bit line, and two cascade-connected selection gates provided between the main bit line and sub-bit lines respectively and selectively connecting one of the sub-bit lines to the main bit line.

Further, according to the present invention, there is provided a semiconductor non-volatile memory device including one or more memory blocks, each memory block comprising:

a main bit line, a plurality of sub-bit lines connected to memory transistors and arranged in parallel with respect to the main bit line, and selection gates provided between the main bit line and sub-bit lines respectively and selectively connecting one of the sub-bit lines to the main bit line, a selection gate for sub-bit lines and another selection gate for sub-bit lines being arranged on opposite sides across the memory cell arranged area.

Preferably, there is provided a circuit for holding the non-selected sub-bit lines at a reference potential.

More preferably, one of the above-described two selection gates comprises a depletion type transistor.

Further, according to the present invention, there is provided a semiconductor non-volatile memory device having a plurality of memory transistors with drains connected to the bit lines, sources connected to a common source line, and control gates connected to the word lines, wherein selection gates are provided at the source side of each memory transistor, and wherein, at the time of writing, a predetermined voltage is applied to the control gate of non-selected memory transistor(s) and the selection gate is held at the predetermined potential to cut the current path of the channel of the transistor(s).

Preferably, the selection gate is formed by side walls.

More preferably, at the time of writing, the writing pulses to the bit lines are sequentially applied at predetermined intervals.

More preferably, a plurality of bit lines are divided into a plurality of groups.

Further, according to the present invention, there is provided a decoder circuit which performs the reading of data from a memory cell selected by a word line, the writing of data into the memory cell, and the erasing of data, comprising:

a plurality of sub-decoder used for reading and connected to the word line and a sub-decoder used only for writing and erasing commonly provided for the decoder circuit.

BRIEF DESCRIPTION OF THE DRAWINGS

The above objects and features and other objects and features will be apparent in more detail with reference to the accompanying drawings, in which:

FIGS. 2A and 2B are views of an example of an actual construction of the flash memory cell of FIG. 1, in which FIG. 2A is a plan view of a principal part; and FIG. 2B is a cross-sectional view taken along a line A—A of FIG. 2A;

FIG. 5 is a table of the voltage settings at a selection gate, word line, main bit line and a source line of the flash memory cell of FIG. 3 at the time of reading, erasing, and writing operations;

FIG. 6 is a table of the voltage settings at a drain, gate, and source of a memory transistor of the flash memory cell of FIG. 3 at the time of reading, erasing, and writing operations;

FIG. 7 is a table of the states of the floating gate at the time of reading, erasing, and writing operations of the flash memory cell of FIG. 3 and the phenomenon caused in the cell at that time;

FIGS. 9A to 9E are a timing chart of a writing pulse applied to a word line and a bit line of a flash memory adopting the FN tunnel/FN tunnel system according to the present invention;

FIGS. 15A to 15C are views of the voltage settings of signals etc. at the time of operation of a sub-row decoder; FIGS. 15A and 15B are tables of the voltage settings of signals etc., at the time of operation of a sub-row decoder, and FIG. 15C is a timing chart of the voltage setting of signals at the time of erasing in FIG. 15A;

FIG. 16 is a block diagram of another structural example of a decoder circuit of a fourth embodiment of the present invention;

FIG. 19 is a table of the voltage settings at the time of reading, erasing, and writing operations by the circuit of FIG. 17;

FIG. 21 is a table of the bias state of the main bit line, selection gate line, word line, and source line when one sub-bit line is selected and data is written in the circuit of FIG. 20;

FIGS. 23A to 23C are explanatory views of a production process of the memory cell of FIG. 22; wherein FIG. 23A is a cross-sectional view taken along a line XXIIIA,B,C in FIG. 22 for explaining the production process up to the formation of the 1-Al contact hole; FIG. 23B is a cross-sectional view taken along a line XXIIIA,B,C in FIG. 22 for explaining the production process for forming a sub-bit line; and FIG. 23C is a cross-sectional view taken along a line XXIIIA,B,C in FIG. 22 for explaining the production process for forming a 2-Al main bit line;

FIGS. 25A and 25B are views of the construction of the selection gate comprised of side walls of a ninth embodiment of the present invention, wherein FIG. 25A is a view of an example in which it is provided on one side of the control gate and floating gate and FIG. 25B is a view of an example in which it is provided on both sides of the control gate and floating gate;

FIG. 28 is a table of voltage settings of lines at the time of reading, erasing, and writing operations of the circuit and the status transition of the respective memories.

DESCRIPTION OF THE PREFERRED EMBODIMENTS

A detailed explanation will be made of embodiments of the present invention.

Figure 1:
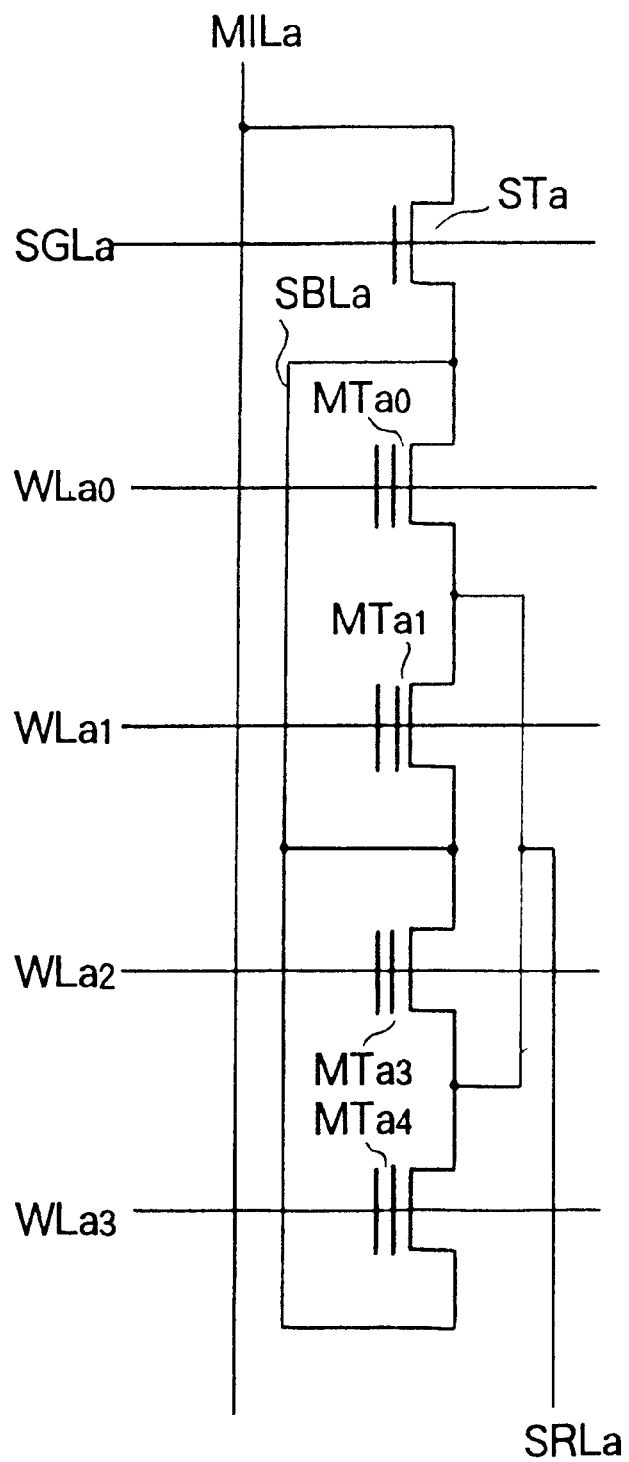
FIG. 1 is a view of the arrangement and configuration of a NOR type flash memory cell.
Figure 2A:
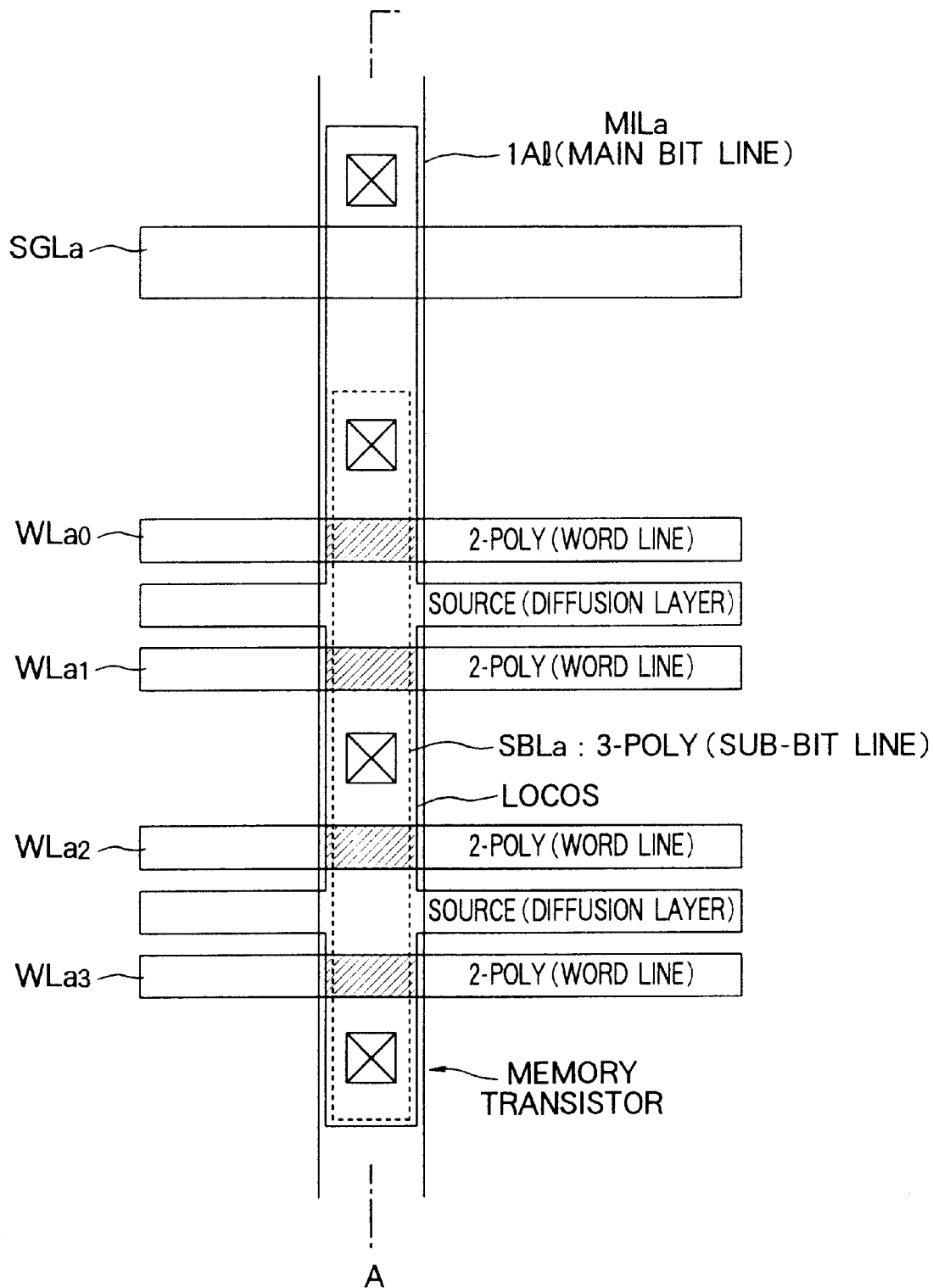
Figure 2B:
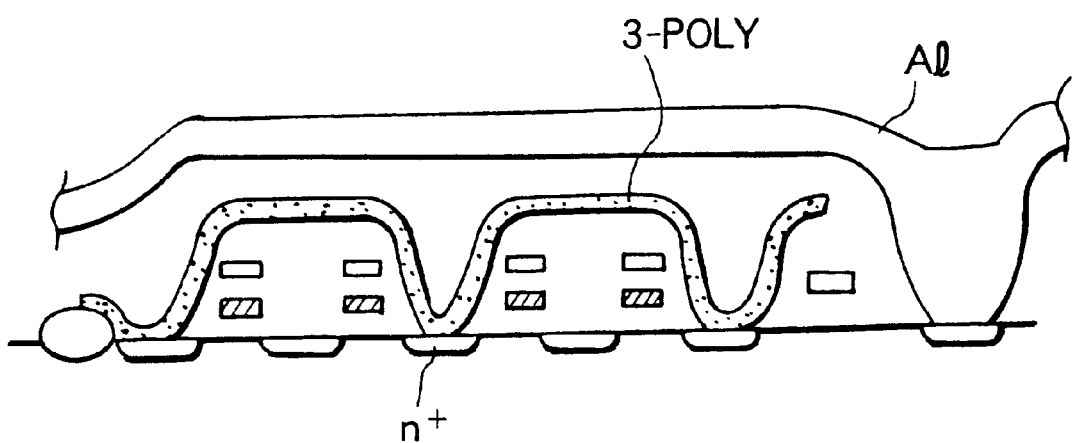
Figure 3:
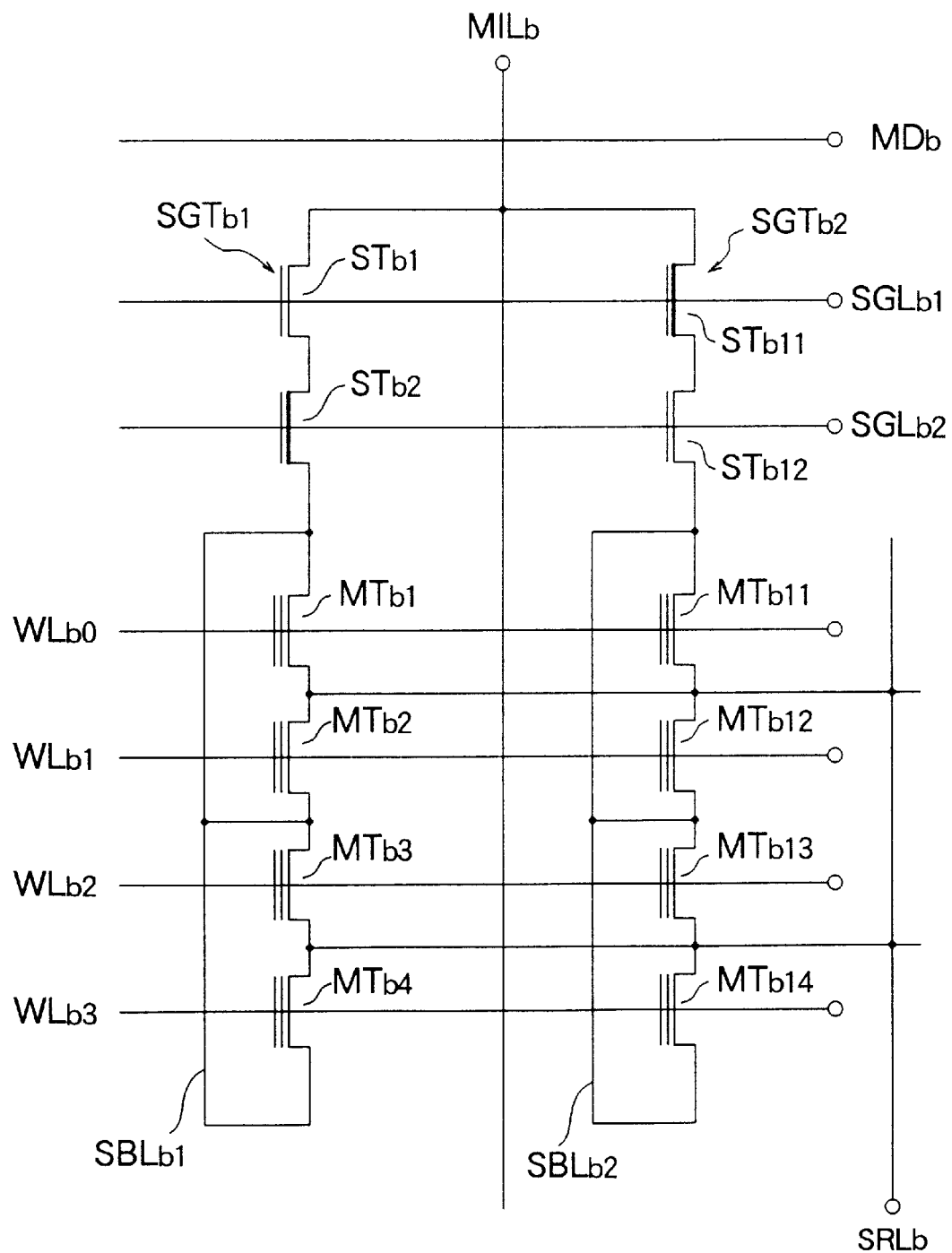
FIG. 3 is a view of the arrangement and configuration of a first embodiment of the NOR type flash memory cell according to the present invention.
Figure 4:
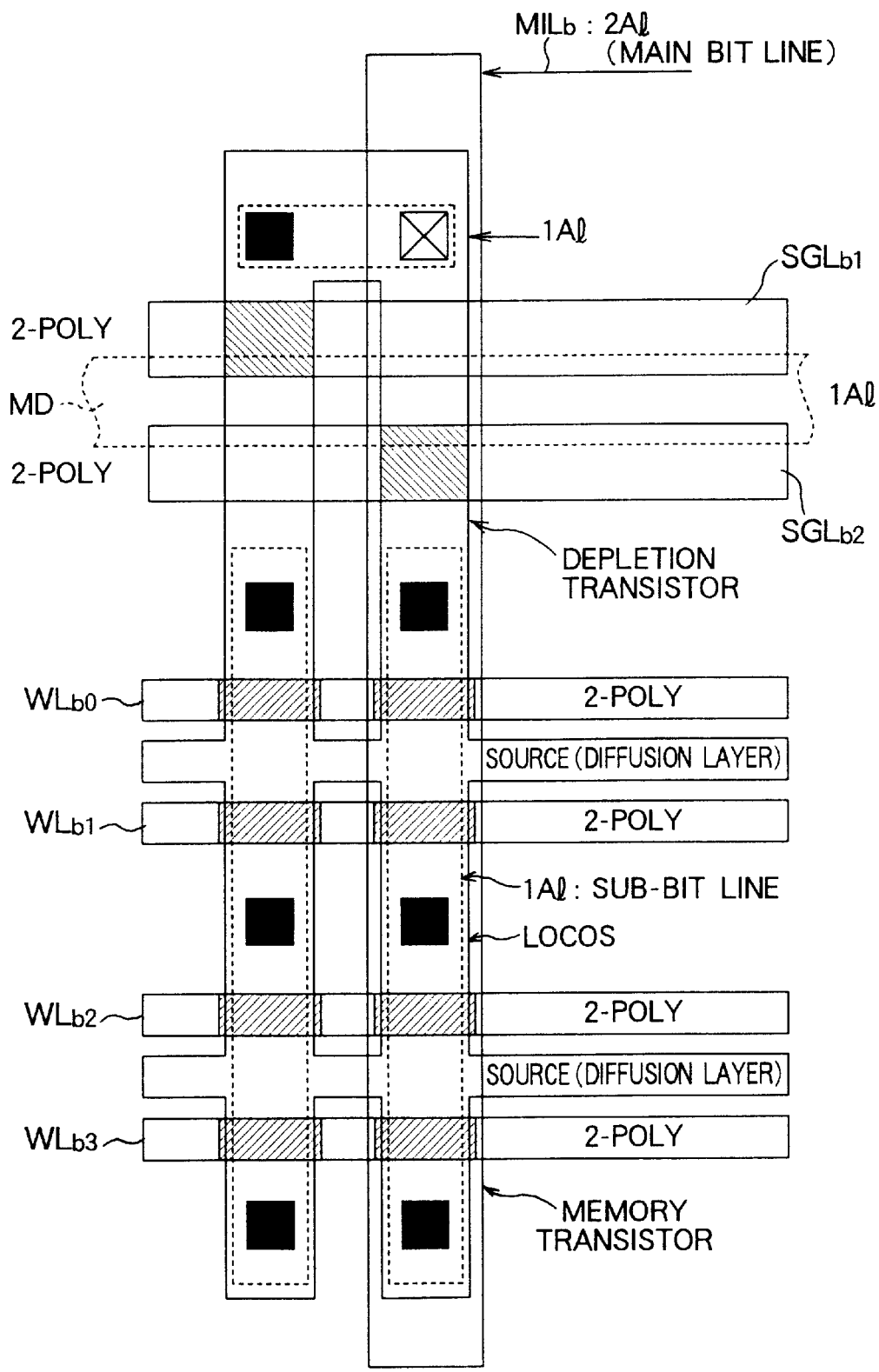
FIG. 4 is a view of an example of the actual construction of a flash memory cell of FIG. 3.
Figure 8A:
FIGS. 8A to 8D are a timing chart of a writing pulse applied to a word line and a bit line of a general flash memory adopting an FN tunnel/FN tunnel system.
Figure 8B:
Figure 8C:
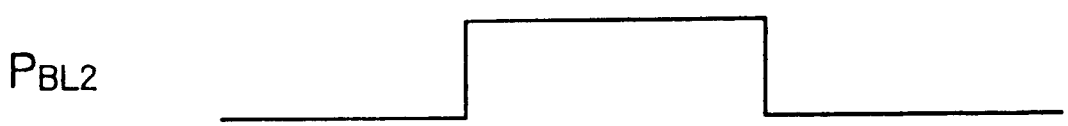
Figure 8D:
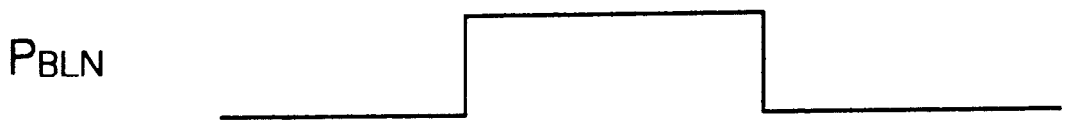

FIG. 3 is a view of the arrangement and configuration of a first embodiment of a NOR type flash memory cell according to the present invention; and FIG. 4 is a plan view of a principal part showing an example of the actual construction of the flash memory cell of FIG. 3.

$MIL_b$ denotes a main bit line; $SBL_{b1}$ and $SBL_{b2}$ denote sub-bit lines; $SRL_b$, a source line; $SGL_{b1}$ and $SGL_{b2}$ denote selection gate lines which are lines for selecting gates; $MD_b$, a main row decode line; $SGT_{b1}$ and $SGT_{b2}$ denote selection gates each of which includes a transistor functioning as a gate; $ST_{b1}$, $ST_{b2}$, $ST_{b11}$ and $ST_{b12}$ denote selection transistors constituting selection gates $SGT_{b1}$ and $SGT_{b2}$; $MT_{b1}$ to $MT_{b4}$ and $MT_{b11}$ to $MT_{b14}$ denote memory transistors; and $WL_{b0}$ to $WL_{b3}$ denote word lines; respectively.

The memory cell of this embodiment is constituted in such a manner that two sub-bit lines $SBL_{b1}$ and $SBL_{b2}$, to each of which are connected i number of memory transistors $MT_{b1}$ to $MT_{b4}$ and $MT_{b11}$ to $MT_{b14}$ (four in the present embodiment), are connected to one main bit line $MIL_b$ in parallel. As the selection gates $SGT_{b1}$ and $SGT_{b2}$ arranged between the main bit line $MIL_b$ and each of sub-bit lines $SBL_{b1}$ and $SBL_{b2}$, two selection transistors $ST_{b1}$ and $ST_{b2}$ and $ST_{b11}$ and $ST_{b12}$ are connected in series, respectively.

The selection transistor $ST_{b1}$ of the selection gate $SGT_{b1}$ and the selection transistor $ST_{b12}$ of the selection gate $SGT_{b2}$ are constituted by enhancement type transistors, and the selection transistor $ST_{b2}$ of the selection gate $SGT_{b1}$ and the selection transistor $ST_{b11}$ of the selection gate $SGT_{b2}$ are constituted by depletion type transistors.

Among the transistors $ST_{b1}$, $ST_{b2}$, $ST_{b11}$, and $ST_{b12}$ of the selection gates $SGT_{b1}$ and $SGT_{b2}$, the gate of the enhancement type selection transistor $ST_{b1}$ of the selection gate $SGT_{b1}$ and the gate of the depletion type selection transistor $ST_{b11}$ of the selection gate $SGT_{b2}$ are connected to the selection gate $SGL_{b1}$, and the gate of the depletion type selection transistor $ST_{b2}$ of the selection gate $SGT_{b1}$ and the gate of the enhancement type selection transistor $ST_{b12}$ of the selection gate $SGT_{b2}$ are connected to the selection gate line $SGL_{b2}$.

In this way, by adopting an arrangement in which one of the selection gates $SGT_{b1}$ and $SGT_{b2}$ is constituted by the depletion type transistor and two serially connected selection transistors $ST_{b1}$ and $ST_{b2}$ and $ST_{b11}$ and $ST_{b12}$ are provided, the structure can be comprised of two sub-bit lines $SBL_{b1}$ and $SBL_{b2}$ and one main bit line $MIL_b$, and therefore a space for wiring the 2-Al lines is obtained.

Also, as shown in FIG. 4, it is possible to make contact between the 2-Al and diffusion layer via the 2-Al→1-Al→diffusion layer.

Accordingly, the formation of contacts becomes easy.

Note that, the addition of one selection gate leads to an increase of the cell size, but this becomes about 1.6 $\mu$m/32= 0.05 $\mu$m converted to the number per memory cell, which corresponds to the amount of an increase of about 3 percent, so there is no problem.

Also, in the production process, the number of masks can be decreased by an amount corresponding to the contact between the 3-POLY and 3-POLY, but there is a case where the number of masks for adjusting the threshold value voltage Vth of the depletion type transistor is increased by one, and therefore substantially the amount of reduction becomes the amount of one mask.

FIGS. 5 to 7 show the voltage settings of different portions at the time of reading, erasing, and writing operations of the flash memory cell of FIGS. 3 and 4, wherein FIG. 5 shows the voltage settings at the selection gate, word line, main bit line, and source line at the time of these operations; FIG. 6 shows the voltage settings at the drain, gate, and source of the memory transistor at the time of the respective operations; and FIG. 7 shows the status of the floating gate at the time of these operations and the phenomenon occurring in the cell at that time.

An explanation will be made below of the voltage settings at the time of reading, erasing, and writing and the phenomenon occurring in the memory cell based on these figures.

At the time of a reading operation, as shown in FIG. 5, the selected selection gate line is set to 3V, the selection word line connected to the gate of the memory cell is set to 3.5V, and the main bit line connected to the drain of the memory cell via the selection gate is set to 1V. Also, as shown in FIGS. 5 and 6, the source line $SRL_b$ is set to 0V at all of the operations and held thereat. Accordingly, also the source of the memory cell is held at 0V.

Along with the above voltage settings of the lines, the gate of the selection memory cell is held at the potential of 3.5V, the drain is held at 1V, and the source is held at 0V.

At this time, as shown in FIG. 7, where the floating gate FG is discharged, the cell current flows.

Contrary to this, the cell current does not flow in the case of the electron injected state of the floating gate FG.

At the time of an erasing operation, as shown in FIG. 5, the selected selection gate line is set to 0V, the selection word line connected to the gate of the memory cell is set to 20V, and the main bit line connected to the drain of the memory cell via the selection gate is set to 0V. Also, the source line $SRL_b$ is set to 0V and held as mentioned above.

Along with the above voltage settings of the lines, the gate of the selection memory cell is held at the potential of 20V, the drain is held at 0V, and the source is held at 0V.

At this time, as shown in FIG. 7, a tunneling phenomenon of electrons from the substrate, source (S)/drain(D), to the floating gate FG is induced, and the floating gate FG becomes the state injected with electrons.

At the time of writing, as shown in FIG. 5, the selected selection gate line is set to 7V, the selection word line connected to the gate of the memory cell is set to −12V, and the main bit line connected to the drain of the memory cell via the selection gate is set to 5V or 0V. Also, the source line $SRL_b$ is set to 0V and held as mentioned above.

Along with the above voltage settings of the lines, the gate of the selection memory cell is held at the potential of −12V, the drain is held at 5V or 0V, and source is held at 0V.

At this time, as shown in FIG. 7, a tunneling phenomenon of electrons from the floating gate FG to the drain is induced where the drain is at 5V, and the floating gate FG becomes discharged in state from the electron injected state.

Where the drain is at 0V, the electric field is weak, and therefore a tunneling phenomenon of the electrons from the floating gate FG to the drain is not induced, and the floating gate FG does not change but maintains its electron injected state.

As explained above, a flash memory having the construction of FIG. 3 and FIG. 4 does not adopt a hot electron/FN tunnel injection method where channel hot electrons are injected into the floating gate FG at the time of writing and where electrons are discharged from the floating gate FG to the source by the FN tunneling at the time of erasing and can perform the writing and erasing of data well by the FN tunneling effect and therefore can achieve a reduction of voltage.

Also, as mentioned above, there are advantages that a reduction of the number of masks and the number of manufacturing steps at the time of production can be achieved and a difficult technology is not needed, and therefore the costs are low and the sub-bit lines $SBL_{b1}$ and $SBL_{b2}$ can be formed by aluminum (Al) with its low resistance, not by a 3-POLY having a high resistance, and therefore an improvement of speed such as a reduction of the accessing time can be achieved.

Note that, in the flash memory of the present embodiment, in actuality, the erasing is carried out in units of i lines connected to the selection gate, for example, 32 lines. The writing is simultaneously carried out on the number of cells equal to the number of the main bit line $MIL_b$, for example, 512 bytes worth of cells. For this reason, a number of latches (registers) equal to the number of the main bit lines $MIL_b$ are provided.

Also, in the flash memory cell of the present embodiment, it becomes impossible to form the source lines $SRL_b$ at the 1-Al wiring layer where it is intended that the main bit lines $MIL_b$ be formed by the 2-Al wiring, sub-bit lines $SBL_b$ be formed by the 1-Al wiring, and further a wiring layer is formed in the word line direction at another 1-Al which is necessary for the decoder circuit, etc., and therefore it is formed at the same 2-Al as that of the writing layer forming the main bit lines $MIL_b$ of the memory cells.

In the NOR type flash memory according to the present embodiment, as mentioned above, both of the writing and erasing operations are carried out by the FN tunneling phenomenon, and therefore they are carried out with a low current consumption in comparison with the writing operation of a flash memory in which the channel hot electron (CHE)/FN tunnel phenomenon is adopted.

For this reason, the writing operation is carried out in parallel for all bit lines.

FIG. 8 is a timing chart showing a writing pulse applied to a word line and bit line of a flash memory adopting this FN tunnel/FN tunnel phenomenon. In FIG. 8, $P_{WL}$ denotes a word line writing pulse; and $P_{BL1}$ to $P_{BLN}$ (note, N is a positive integer) denote the bit line writing pulses; respectively.

As shown in FIG. 8, in a general flash memory adopting the FN tunnel/FN tunnel phenomenon, the writing pulses $P_{BL1}$ to $P_{BLN}$ are applied at the same timing to all bit lines.

However, in the case of a NOR type flash memory, a drain-substrate band current IDB much larger than the gate current IG caused by FN tunneling phenomenon flows at the time of data writing.

For this reason, as shown in FIG. 8, where the writing pulses $P_{BL1}$ to $P_{BLN}$ are applied at the same timing to all bit lines and the writing operation is carried out in parallel for all bit lines, a great current flows between the drain and substrate.

As a result, it is necessary to greatly enhance the capability of the booster circuit, and thus it becomes difficult to operate the flash memory device by a single power source.

Figures 9A, 9B, 9C, 9D, 9E:
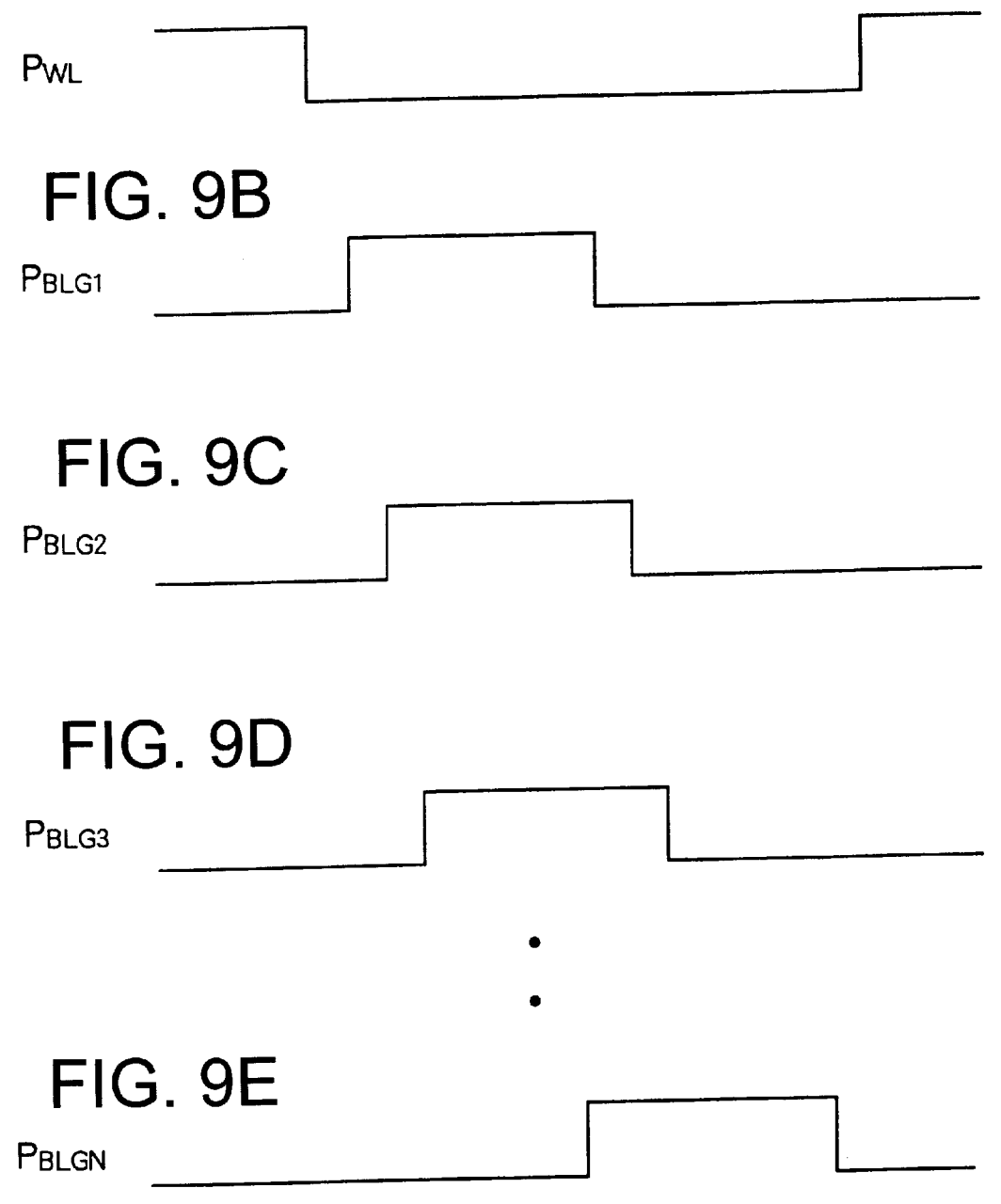

Therefore, in the data writing operation of the NOR type flash memory of FIG. 3, desirably the constitution is made so that, as shown in FIG. 9, the writing pulses $P_{BLG1}$ to $P_{BLGN}$ to the bit lines are shifted from each other in a single word line writing pulse $P_{WL}$ and are sequentially applied at predetermined intervals.

Also, preferably, to keep down the increase of the writing time etc., desirably the bit lines are divided into a plurality of bit line groups of units of one or more bit lines, and writing bit line pulses shifted in timing are applied to the groups of bit lines.

Below, an explanation will be made of the reason why operation by a single power source becomes possible by applying the bit line writing pulses $P_{BLG1}$ to $P_{BLGN}$ while shifting the same, referring to FIG. 10 and FIG. 11.

Figure 10:
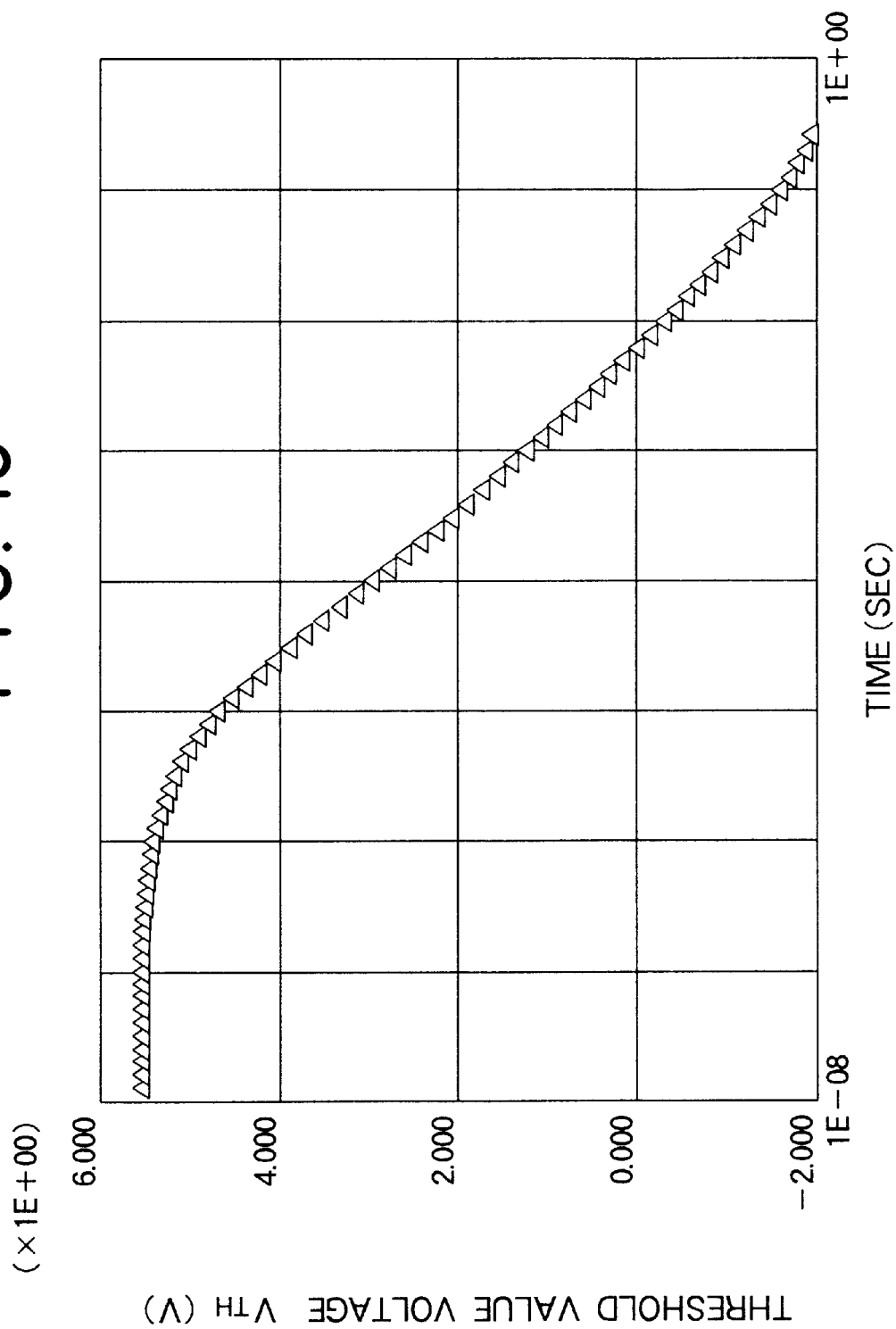
FIG. 10 is a view of the results of a writing operation calculated by simulation using the device parameter of a NOR type flash memory formed as a prototype by a standard 0.6 $\mu$m process.

FIG. 10 is a view of the results of a writing operation calculated by simulation using the device parameter of a NOR type flash memory formed as a prototype by a standard 0.6 μm process.

In FIG. 10, the abscissa represents the time, and the ordinate represents the threshold value voltage $V_{TH}$. Also, in this simulation, a "1" data writing operation of one bit line worth of data was carried out.

As seen from FIG. 10, in about 1 msec (mill;second) writing time, the threshold value voltage $V_{TH}$ changes from 5.5V to 1.5V and the writing is completed.

Figure 11:
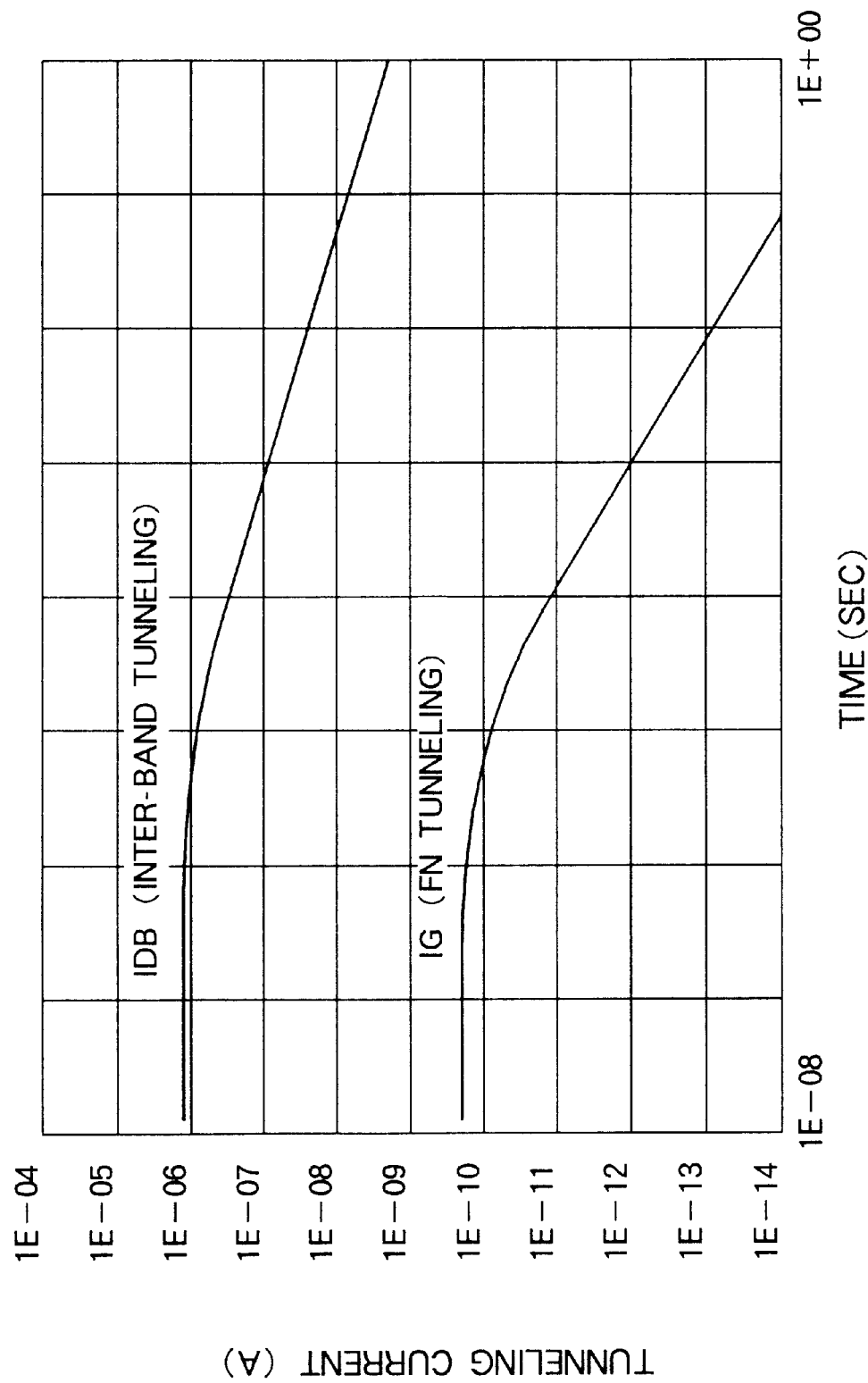
FIG. 11 is a view of the drain-substrate current obtained by tunneling between the gate current and band according to FN tunneling at the time of a writing operation.

FIG. 11 is a view of a gate current IG resulting from FN tunneling phenomenon in the writing operation of FIG. 10 and the drain-substrate current IDB resulting from interband tunneling.

In FIG. 11, the abscissa represents the time, and the ordinate represents a value of the current.

As shown in FIG. 11, both of the gate current IG and drain-substrate current IDB are reduced along with the progress in the writing operation. It is an important point here that the drain-substrate current IDB be larger than the gate current IG by an amount close to four powers and has become 1 $\mu$A or more per bit line.

Accordingly, as mentioned above, as shown in FIG. 8, where the writing pulses $P_{BL1}$ to $P_{BLN}$ are applied to all bit lines at the same timing, and the writing operation is carried out in parallel for all bit lines, a large current flows between the drain and the substrate, and it becomes difficult to operate the flash memory device by a single power source.

Contrary to this, if it is assumed that the writing pulse is shifted only by 100 $\mu$sec, as shown in FIG. 11, the drain-substrate current IDB is greatly reduced to about ¼ to ⅕ from when the writing pulse is applied to when the writing pulse of the bit lines is applied next.

Therefore, as mentioned above, as shown in FIG. 9, desirably the writing pulses $P_{BLG1}$ to $P_{BLGN}$ are respectively shifted within a single word line writing pulse $P_{WL}$ and sequentially applied at predetermined intervals. For suppressing the increase of the writing time, etc., desirably the device is constituted so that the bit lines are divided into a plurality of groups of bit lines of units of one or more bit lines, and the writing bit line pulses shifted in timing are applied to the groups of bit lines.

For example, when assuming that there are a total of 1000 bit lines, the bit lines are divided into 10 groups of bit lines in units of 100 bit lines.

Then, by setting for example the writing pulse width to 1 msec and the pitch of shifting of the timing of the groups of bit lines to 100 $\mu$sec and applying a writing pulse of 1 msec with a timing shift of 100 $\mu$sec, it is possible to greatly reduce the drain-substrate current IDB o about ¹⁄₁₀. Note that, it is sufficient if the writing time at this time is increased to 2 msec, i.e., merely bout 2 times.

As a result, it becomes possible to operate the flash memory device by a single power source without limitation by the capability of the booster circuit.

Figure 12:
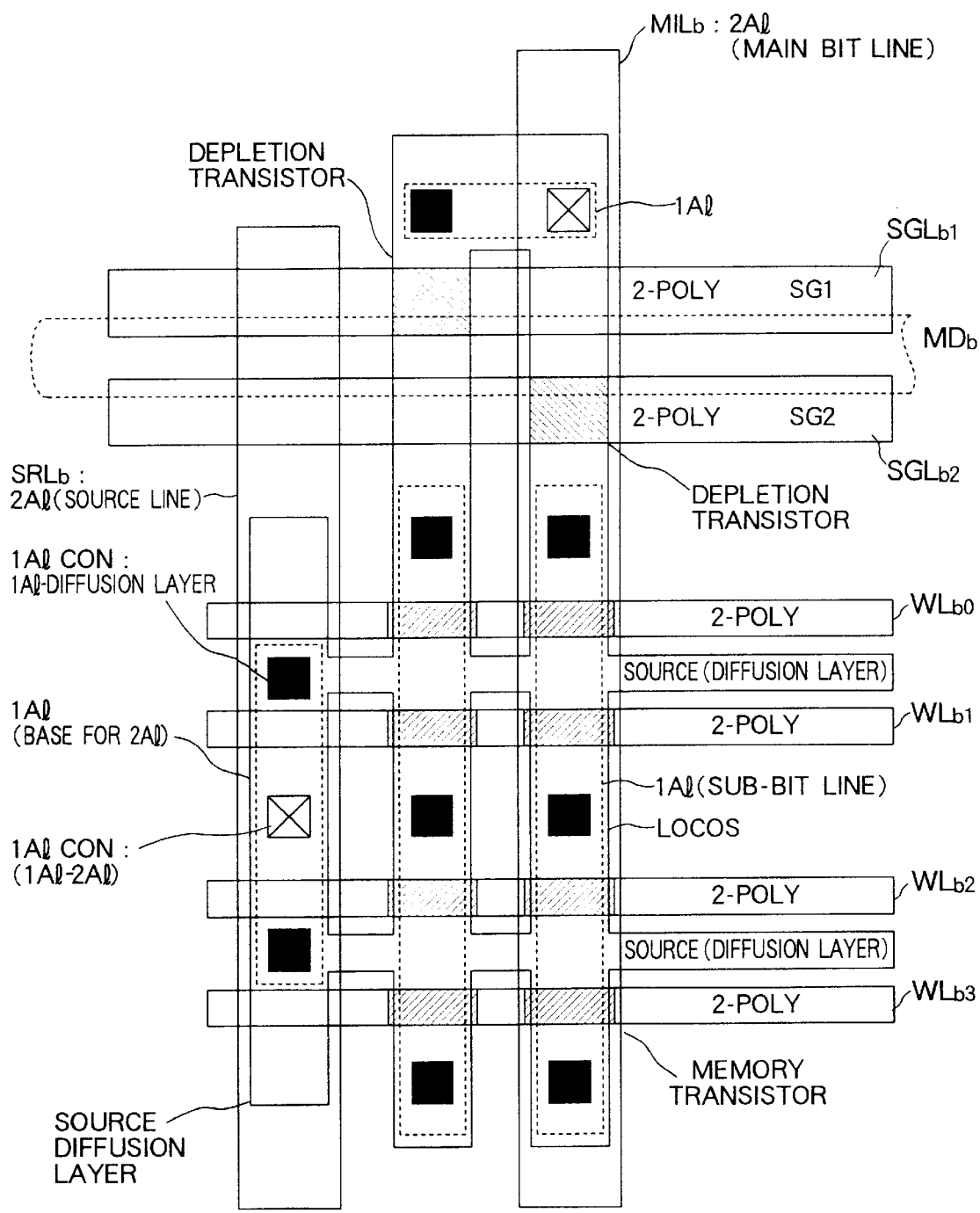
FIG. 12 is a plan view of an example of an actual construction of a flash memory cell of FIG. 3 including the source line.

FIG. 12 is a plan view of an example of the actual construction of the flash memory cell of FIG. 3 including the source lines SRL.

Where the source lines $SRL_b$ are formed at the 2-Al, when it is intended to bury the source-contact by solely the 2-Al wiring layer, there is a large step difference between the source formed by the diffusion layer of the cell and the 2-Al of the wiring layer, and there is a danger such that aluminum will not be sufficiently buried in the contact by the 2-Al wiring layer alone. When it is intended to enlarge the aluminum contact (Con) size so that this step difference can be absorbed and further make the aluminum contact tapered in shape to raise the burying characteristic by the 2-Al alone, the size of the source—contact part becomes extremely large.

Therefore, in the present embodiment, when forming the source lines $SRL_b$, aluminum is deposited from the diffusion layer to the layer 1-Al further deposited to the layer 2-Al, to thereby formed the source lines formed as a 2-Al structure.

Concretely, the layer 1-Al, which is the same layer as that for the wiring running in the direction of the sub-bit lines or the word lines of the memory cells, is formed on the source diffusion layer and then the 2-Al contacts (Con) are patterned at the upper portion thereof to form the wiring layer in the 2-Al.

By adopting such a construction, formation of memory cells becomes possible without inducing an increase of the size of the source-contact part, and there is an advantage that the source lines can be easily formed.

An explanation will be made next of a second embodiment of the present invention.

Figure 13:
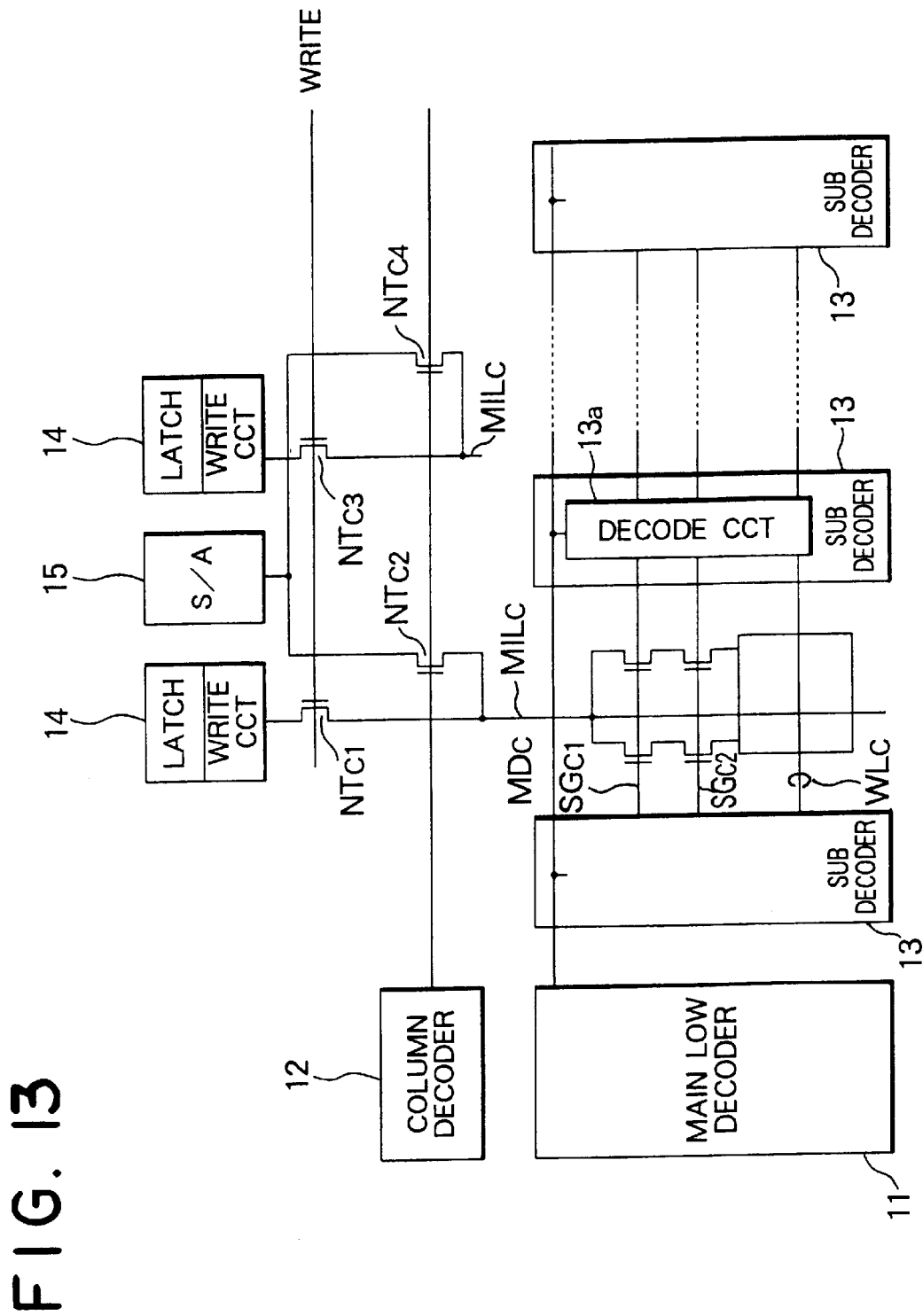
FIG. 13 is a block diagram of a structural example of a memory array of a second embodiment of the present invention.

FIG. 13 is a block diagram of an example of the configuration of a memory array using the above-mentioned memory cells.

In FIG. 13, 11 denotes a main row decoder; 12, a column decoder; 13, a sub-decoder; 13a, a decode circuit; 14, a latch/writing circuit; 15, a sense amplifier (S/A); and $NT_{c1}$ to $NT_{c4}$ denote n-channel MOS transistors.

In this example, a latch/writing circuit 14 is provided for every main bit line $MIL_c$, but the constitution is made so that one sense amplifier 15 is provided for a plurality of main bit lines $MIL_c$.

The size of the cells of the flash memory is small, and the pitch of the word lines $WL_c$ is one which does not enable to lay the word lines in a one-to-one correspondence at 2-Al, and therefore to achieve an enhancement of speed and achieve a reduction of the chip size, a structure of a main row decoder and sub-row decoder becomes indispensable.

An explanation will be made next of a third embodiment of the present invention.

Figure 14:
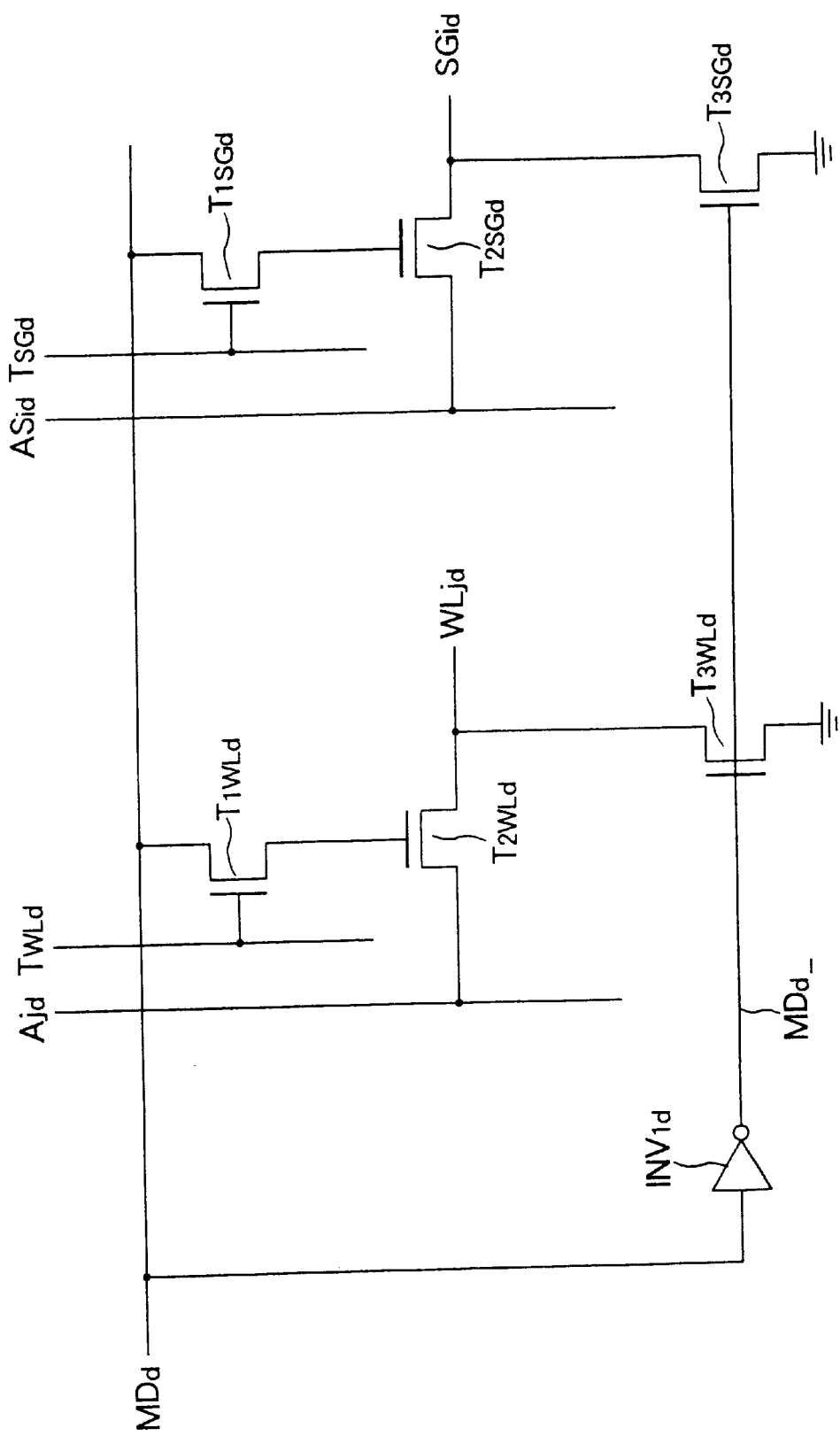
FIG. 14 is a circuit diagram of a structural example of a sub-decoder of a third embodiment of the present invention.

FIG. 14 is a circuit diagram of an example of the configuration of a sub-row decoder.

In FIG. 14, $T_{1WLd}$ to $T_{3WLd}$ and $T_{1SGd}$ to $T_{3SGd}$ denote n-channel MOS transistors; and $INV_{1d}$ denotes an inverter.

The n-channel MOS transistors $T_{1WLd}$ to $T_{3WLd}$ and $T_{1SGd}$ to $T_{3SGd}$ are constituted by transistors having a so-called double well construction.

In this structure, the main row decode line $MD_d$ has connected to it the source of n-channel MOS transistors $T_{1WLd}$ and $T_{1SGd}$ for controlling the gate voltage and the input of the inverter $INV_{1d}$.

The gate of the n-channel MOS transistor $T_{1WLd}$ is connected to the input line of the signal $T_{WLd}$, and the drain is connected to the gate of the n-channel MOS transistor $T_{2WLd}$.

The source of the n-channel MOS transistor $T_{2WLd}$ is connected to the input line of the signal $A_{jd}$, and the drain is connected to the drain of the n-channel MOS transistor $T_{3WLd}$.

The gate of the n-channel MOS transistor $T_{1SGd}$ is connected to the input line of the signal $T_{SGd}$, and the drain is connected to the gate of the n-channel MOS transistor $T_{2SGd}$.

The source of the n-channel MOS transistor $T_{2SGd}$ is connected to the input line of the signal $AS_{jd}$, and the drain is connected to the gate of the n-channel MOS transistor $T_{3SGd}$.

The sources of the n-channel MOS transistor $T_{3WLd}$ and $T_{3SGd}$ are grounded, and the gates are connected to the outputs of the inverter $INV_{id}$.

The circuit configuration of this sub-row decoder is a general one. FIGS. 15A to 15C show the voltage settings of the signals at the time of the operation thereof etc.

Here, as the power source, a single 3V is assumed. 3.5V is a voltage obtained by a bootstrap manner, and 5V, 7V, 20V, and −12V are voltages obtained by the booster circuit.

A detailed explanation based on FIGS. 15A to 15C will be omitted, but in the present configuration, the n-channel MOS transistors $T_{1WLd}$ and $T_{1SGd}$ are provided for boosting the gate voltage of the n-channel MOS transistors $T_{2WLd}$ and $T_{2SGd}$ at the time of reading. They are unnecessary transistors at the time of erasing and writing.

At the time of writing, the voltage resistance is never exceeded, so there is no problem, but at the time of erasing, there is a danger that the gate voltage of the n-channel MOS transistor $T_{2WLd}$ will exceed 30V.

For this reason, the construction is made so that, as the voltage applied at the time of erasing, as shown in FIG. 15, first $A_{jd}$ is set to 10V, then the main row decoder line $MD_d$ is raised from 0V to 20V, and thereafter $A_{jd}$ is raised to 20V.

By this, it is possible to suppress the gate voltage of the n-channel MOS transistor $T_{2WLd}$ to 22V to 24V.

An explanation will be made next of a fourth embodiment of the present invention.

FIG. 16 is a block diagram of another example of the configuration of a decoder circuit according to the present invention.

Figure 17:
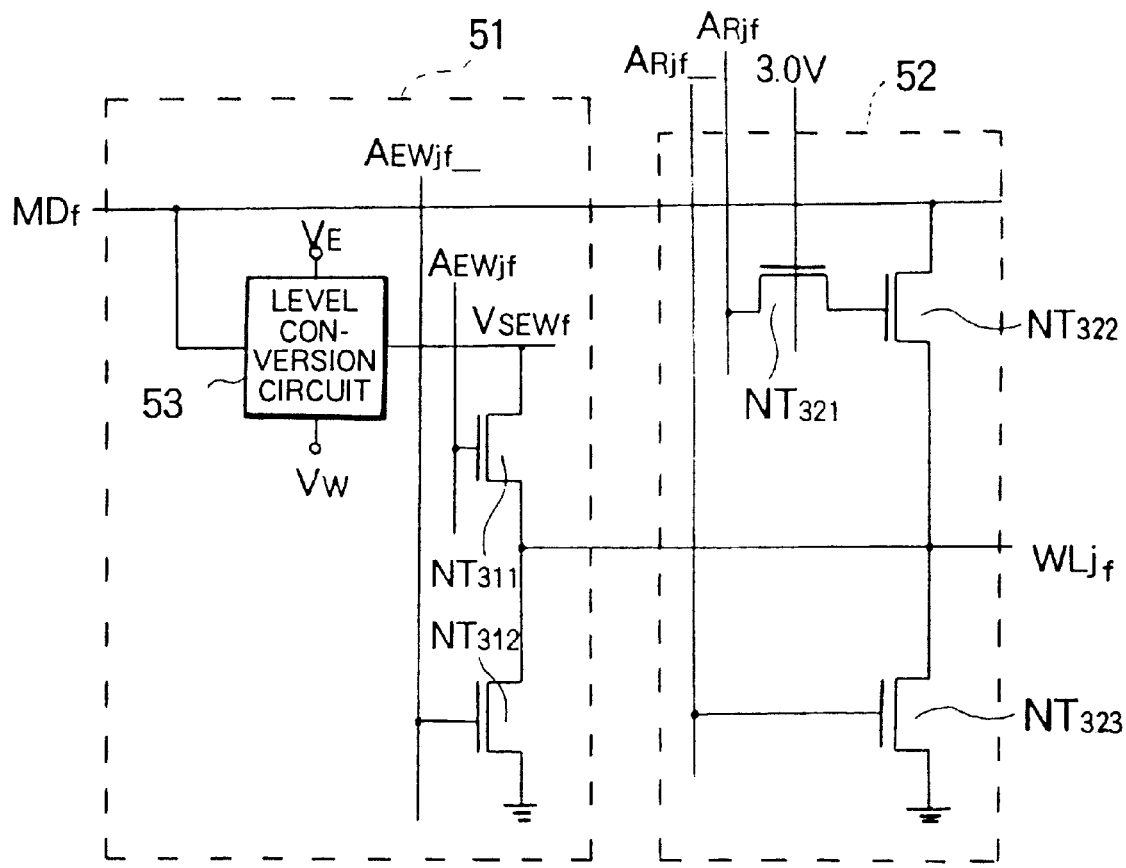
FIG. 17 is a view of a writing/erasing sub-decoder and reading sub-decoder in the circuit of FIG. 16 according to a fifth embodiment of the present invention and a concrete example of a circuit thereof.

The point of difference of the present circuit from the circuit of FIG. 14 is that the circuit is constituted by sub-decoders which divide among them the reading and the writing/erasing operations In FIG. 16, 31 denotes a writing/erasing sub-decoder; and 32, a read out sub-decoder. FIG. 17 shows an example of the concrete circuit thereof.

Just one writing/erasing sub-decoder 31 is provided at the end portion of the word line $WL_e$. Four to eight reading sub-decoders 32, for example, are provided midway on the word line $WL_s$.

As shown in FIG. 17, the writing/erasing sub-decoder 51 is constituted by a level conversion circuit 53 and n-channel MOS transistors $NT_{\beta 11}$ and $NT_{\beta 12}$.

Figure 18:
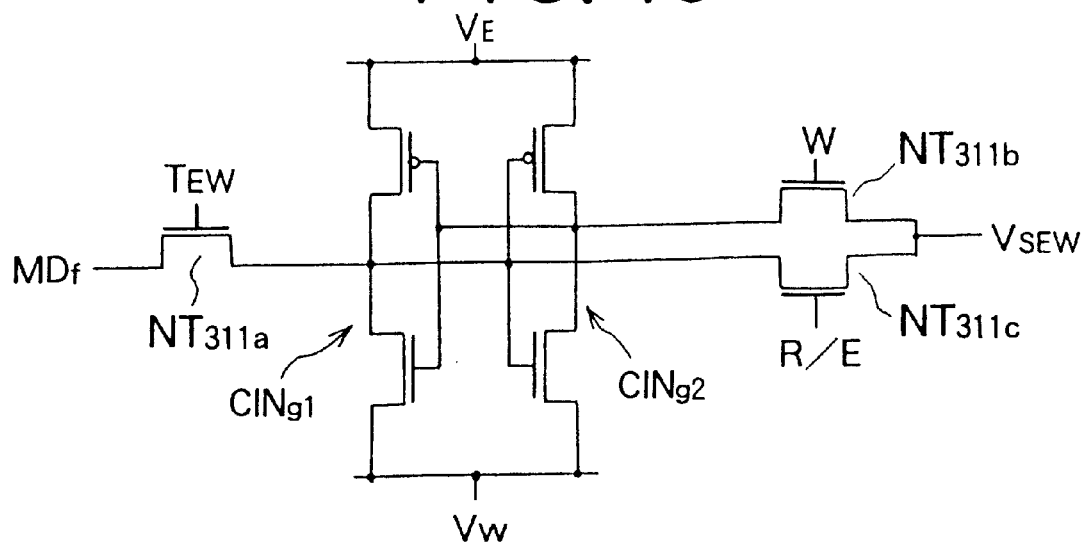
FIG. 18 is a circuit diagram of a structural example of a level conversion circuit in the writing/erasing sub-decoder of FIG. 17.

The level conversion circuit 53 comprises, as shown in FIG. 18, a flip-flop constituted by connecting the two inputs and outputs of a pair of CMOS inverters $CIN_{g1}$ and $CIN_{g2}$ as the principal constituent elements. The input side is connected via the n-channel MOS transistor $NT_{311a}$, whose gate is controlled by the signal $T_{EW}$, to the main row decoder line $MD_f$. The output side is connected via the n-channel MOS transistors $NT_{311b}$ and $NT_{311c}$, which are connected in parallel and whose gates are controlled by the signals W and R/E, to the source of the n-channel MOS transistor $TN_{311}$.

The n-channel MOS transistors of this level conversion circuit 53 are all constituted by transistors having a double well construction and perform the level conversion by lowering the $T_{EW}$, fixing the input of 3V/0V to the flip-flop to 0V or −12V, and cutting it off from the main row decoder line $MD_f$.

Also, the gate of the n-channel MOS transistor $NT_{311}$ of the writing/erasing sub-decoder 51 is connected to the input line of the signal $A_{EWjf}$, the drain is connected to the drain of the n-channel MOS transistor $NT_{312}$, and the midpoint of connection between the drains of the two transistors is connected to one end of the word line WL.

The source of the n-channel MOS transistor $NT_{312}$ is grounded, and the gate is connected to the input line of the signal $A_{EWj-}$.

The reading sub-decoder 52 is constituted by three n-channel MOS transistors $NT_{321}$ to $NT_{323}$.

The source of the n-channel MOS transistor $NT_{321}$ is connected to the input line of the signal $A_{Rjf}$, the drain is connected to the gate of the n-channel MOS transistor $NT_{322}$, and the gate is connected to the 3V supply line.

The source of the n-channel MOS transistor $NT_{322}$ is connected to the main row decoder line $MD_f$, and the drain is connected to the drain of the n-channel MOS transistor $NT_{323}$. The midpoint of connection between the drains of these transistors is connected to the middle of the word line $WL_{jf}$.

The source of the n-channel MOS transistor $NT_{323}$ is grounded, and the gate is connected to the input line of the signal $A_{Rjf-}$.

FIG. 19 is a table of the voltage settings at the time of the reading, erasing, and writing operations by the circuit of FIG. 17.

In this way, in the decoder circuit of FIG. 16, the reading main decoder and sub-decoder for which a high speed operation is required and the writing/erasing sub-decoder for which high speed operation is not required in comparison with that at a reading operation are separately provided. Therefore, an enhancement of speed can be achieved.

Particularly, as shown in FIG. 19, the main decoder can be constituted by just a 3V type transistor, which is suitable to the enhancement of speed.

Figure 20:
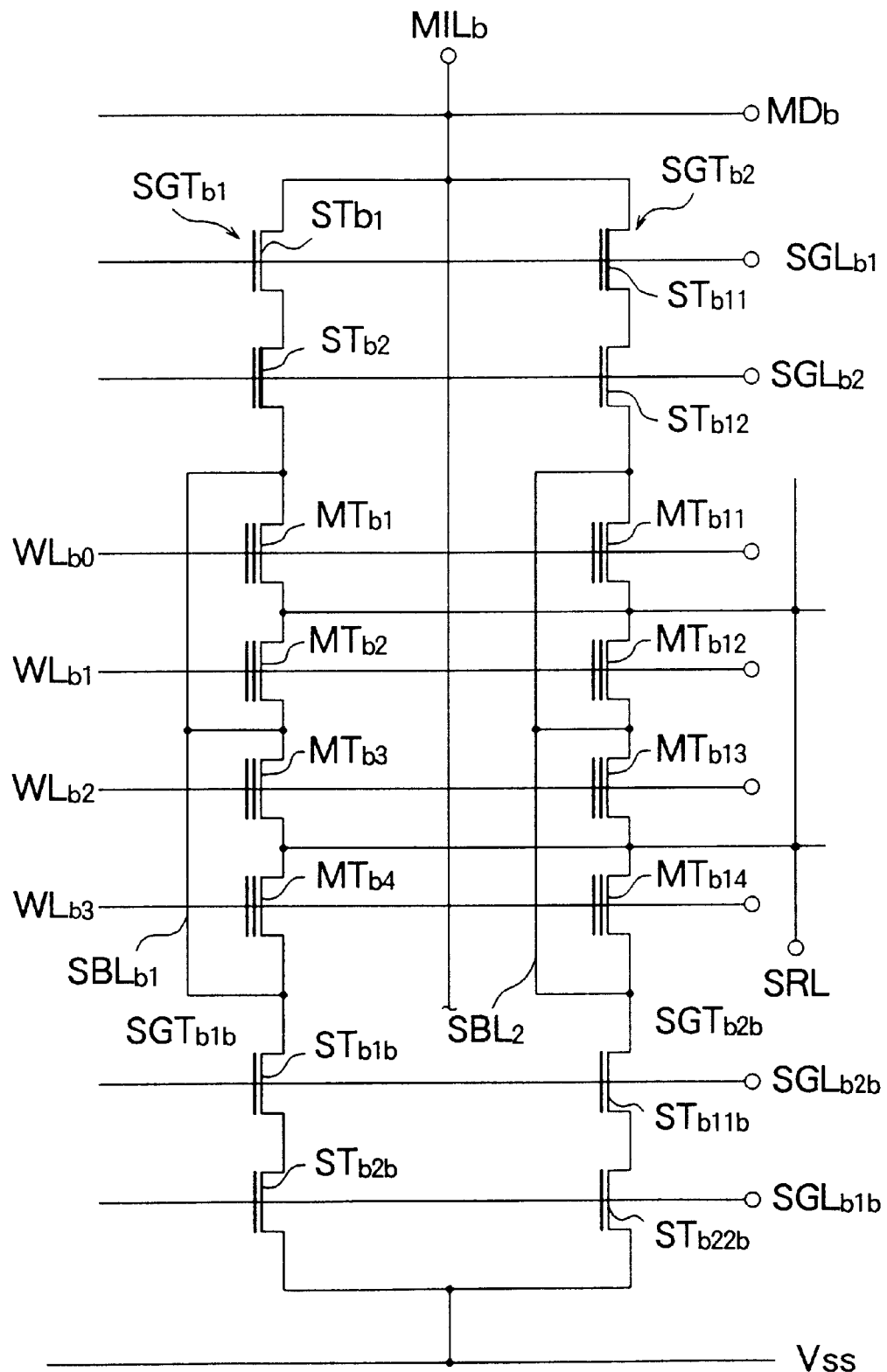
FIG. 20 is a view of the arrangement and configuration of a sixth embodiment of a NOR type flash memory cell according to the present invention.

FIG. 20 is a view of the arrangement and configuration of a fifth embodiment of the NOR type flash memory cell according to the present invention.

The point of difference of the present cell from the cell of FIG. 3 mentioned above resides in the fact that selection gates $SGT_{b1}$ and $SGT_{b2}$ formed by cascade-connecting enhancement type and depletion type selection transistors $ST_{b1}$ and $ST_{b2}$ and $ST_{b11}$ and $ST_{b12}$ are provided between the main bit line $MIL_b$ and the sub-bit lines $SBL_{b1}$ and $SBL_{b2}$, the selection sub-bit line $SBL_{b1}$ or $SBL_{b2}$ is selectively connected with respect to the main bit line $MIL_b$ and, at the same time, further, on the opposite side across from the memory transistor, selection gates $SGT_{b1b}$ and $SGT_{b2b}$ formed by cascade-connecting the enhancement type and depletion type selection transistors $ST_{b1b}$ and $ST_{b2b}$ and $ST_{b11b}$ and $ST_{b12b}$ are similarly provided. The non-selection sub-bit line $SBL_{b2}$ or $SBL_{b1}$ is connected to the $V_{SS}$ (0V) line which is the reference potential.

Among the transistors $ST_{b1b}$ and $ST_{b2b}$ and $ST_{b11b}$ and $ST_{b12b}$ of the selection gates $SGT_{b1b}$ and $SGT_{b2b}$, the gate of the enhancement type selection transistor $ST_{b1b}$ of the selection gate $SGT_{b1b}$ and the gate of the depletion type selection transistor $ST_{b11b}$ of the selection gate $SGT_{b2b}$ are connected to the selection gate line $SGL_{b2b}$, and the gate of the depletion type selection transistor $ST_{b2b}$ of the selection gate $SGT_{b1b}$ and the gate of the enhancement type selection transistor $ST_{b12}$ of the selection gate $SGT_{b2b}$ are connected to the selection gate line $SGL_{b1b}$.

In such a structure, at the time of writing of data, the potentials of the selection gate lines $SGL_{b1}$ and $SGL_{b1b}$ and selection gate lines $SGL_{b2}$ and $SGL_{b2b}$ are controlled to become the same potentials, and the selection gate lines $SGL_{b1}$ and $SGL_{b1b}$ and selection gate lines $SGL_{b2}$ and $SGL_{b2b}$ are held at the complementary potentials.

For example, at the time of writing of data, when the sub-bit line $SBL_{b1}$ is selected, the selection gate lines $SGL_{b1}$ and $SGL_{b1b}$ are set to a high level of 10V, and the selection gate lines $SGL_{b2}$ and $SGL_{b2b}$ are set to a low level of 0V.

By this, the sub-bit line $SBL_{b1}$ is connected to the main bit line $MIL_b$, separated from the $V_{SS}$ line, and the sub-bit line $SBL_{b2}$ is separated from the main bit line $MIL_b$ and connected to the $V_{SS}$ line.

FIG. 21 shows the bias state of the main bit line $MIL_b$, selection gate lines $SGL_{b1}$, $SGL_{b1b}$, $SGL_{b2}$, and $SGL_{b2b}$, the word line $WL_b$, and the source line $SRL_b$ when, in the circuit of FIG. 20, the sub-bit line $SBL_{b1}$ is selected and "1" data or "0" data is written in the memory cell.

As shown in FIG. 21, when the sub-bit line $SBL_{b1}$ is selected and "1" data is written in the memory cell, the main bit line $MIL_b$ is set to 5V to 6V, the selection gate lines $SGL_{b1}$ and $SGL_{b1b}$ are set to 10V, the selection gate lines $SGL_{b2}$ and $SGL_{b2b}$ are set to 0V, the word line $WL_b$ is set to −10V, and the source line $SRL_b$ is kept at the floating state.

Also, "0" data is written in the memory cell, the main bit line $MIL_b$ is set to 0V, the selection gate lines $SGL_{b1}$ and $SGL_{b1b}$ are set to 10V, the selection gate lines $SGL_{b2}$ and $SGL_{b2b}$ are set to 0V, the word line $WL_b$ is set to −10V, and the source line $SRL_b$ is kept at the floating state.

Note that, in the circuit of FIG. 20, at the time of operations other than for writing data, for example, at the time of erasing data and reading data, the potentials of both of the selection gate lines $SGL_{b1b}$ and $SGL_{b2b}$ are set to 0V, and the sub-bit lines $SBL_{b1}$ and $SBL_{b2}$ are separated from the $V_{SS}$ line.

According to the present fifth embodiment, among the two sub-bit lines $SBL_{b1}$ and $SBL_{b2}$, the selection sub-bit line can be connected to the main bit line $MIL_b$, and the non-selection sub-bit line can be connected to the $V_{SS}$ line, and therefore it is possible to prevent the non-selection sub-bit line from entering the floating state. As a result, there is an advantage that unintended writing of data can be suppressed.

Figure 22:
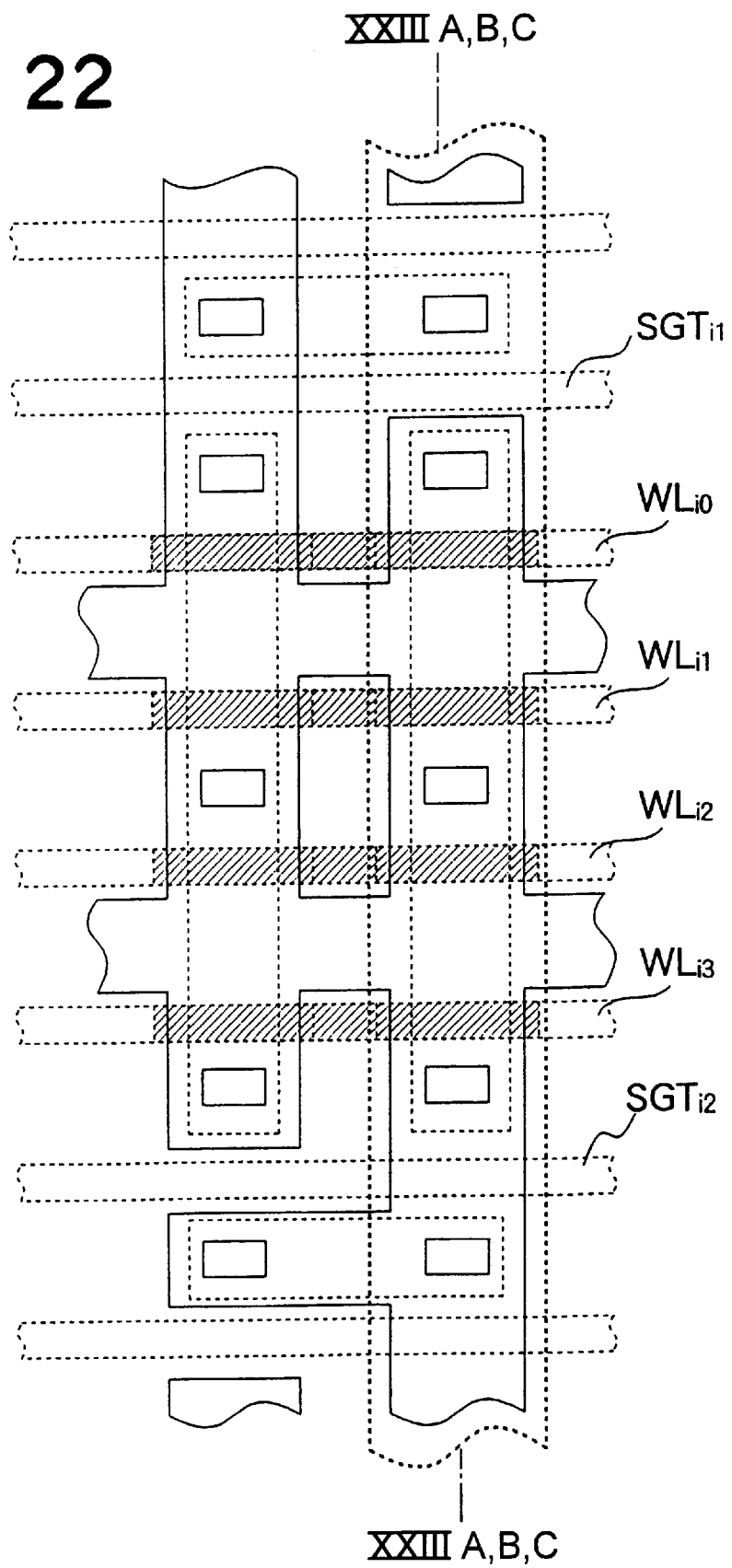
FIG. 22 is a plan view of principal parts showing a seventh embodiment of the flash memory cell according to the present invention.

FIG. 22 is a plan view of the principal part of a circuit showing a sixth embodiment of a flash memory cell according to the present invention.

The point of difference of the present cell from the cell of FIG. 4 mentioned above resides in that instead of arranging two selection gates SGT comprising the selection transistors of two sub-bit lines SBL between the main bit line MIL and the sub-bit line SBL, one selection gate is arranged between the main bit line MIL and the sub-bit line SBL and, at the same time, the other is arranged on the opposite side across from the memory transistor.

As seen from FIG. 22, in the present memory cell, unlike the memory cell of FIG. 4, the depletion type transistor serving as the selection transistor becomes unnecessary.

An explanation will be made next of a seventh embodiment of the present invention.

Figure 23:
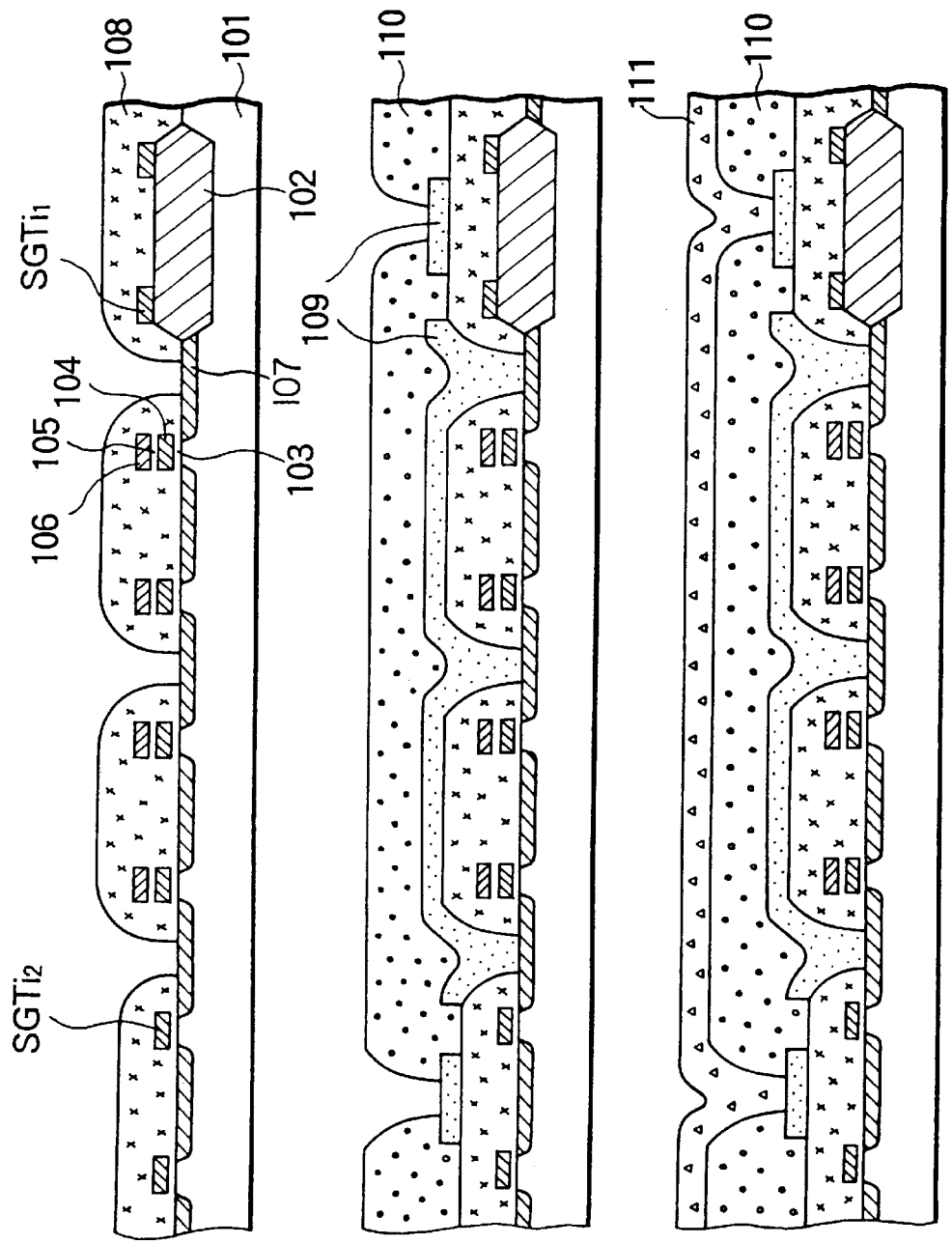

FIGS. 23A to 23C are cross-sectional views taken along a line XXIIIA,B,C of FIG. 22 and indicate the production steps of the present memory cell. An explanation will be made next of a production process of the present memory cell.

First, as shown in FIG. 23A, an inter-element separation film 102 is formed on a p-type substrate 101 by a usual LOCOS method, then an oxide film having a thickness of 10 nm is formed as a first gate insulation film 103.

Next, polycrystalline silicon is deposited for the floating gate 104, and the region in the control gate line direction of the floating gate is defined using the usual photolithography and reactive ion etching (RIE) step.

Thereafter, according to the customary method, an ONO film having a thickness of 20 nm is deposited as a second gate insulation film 105, and then polycrystalline silicon is deposited for the control gate 106 and the word line is formed by the photolithography and RIE step.

Next, an $n^+$ diffusion layer 107 for the source and drain of the memory cell and transistor is formed by the injection of $As^{-1}$ at an energy of 50 kev and a dosage of $5 \times 10^{15}$ cm$^{-2}$.

Thereafter, phospho-silicate glass (PSG) is deposited for the first interlayer insulation film 108, and the 1-Al contact hole is formed by the RIE method.

Thereafter, as shown in FIG. 23B, a 1-Al film is deposited for the sub-bit line 109, and the sub-bit line (SBL) is deposited.

Next, as shown in FIGS. 23B and 23C, a second interlayer insulation film 110 is formed by the PSG, then a 2-Al contact hole is formed, and the 2-Al main bit line 111 is formed.

The production is ended by the above manufacturing steps.

As seen from the above, in the memory cell of FIG. 22, unlike the memory cell of FIG. 4, the depletion type transistor serving as the selection transistor is unnecessary, and therefore the mask for adjusting the threshold voltage Vth of the depletion type transistor which became necessary for producing the memory cell of FIG. 4 becomes unnecessary, and therefore the number of production steps can be further reduced in comparison with the production steps of the memory cell of FIG. 4.

Figure 24:
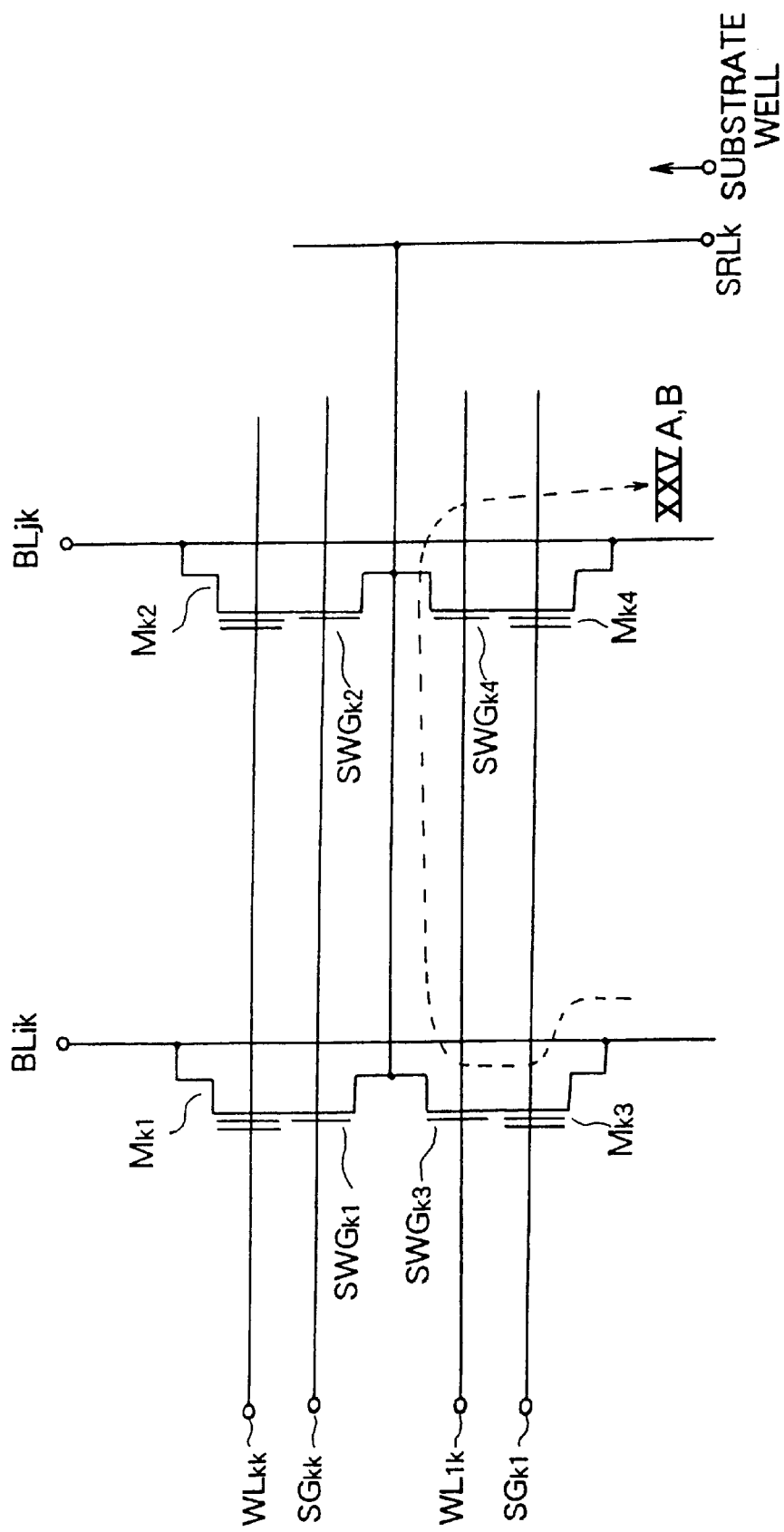
FIG. 24 is a circuit diagram of an eighth embodiment of the flash memory cell according to the present invention.

FIG. 24 is a circuit diagram of an eighth embodiment of the flash memory cell according to the present invention.

In FIG. 24, $M_{k1}$ to $M_{k4}$ denote memory transistors; $SWG_{k1}$ to $SWG_{k4}$ denote selection gates; $BL_{ik}$ and $BL_{jk}$ denote bit lines; $WL_{kk}$ and $WL_{k1}$ denote word lines; and $SG_{kk}$ and $SG_{k1}$ denote selection signal lines; respectively.

Figure 25A:
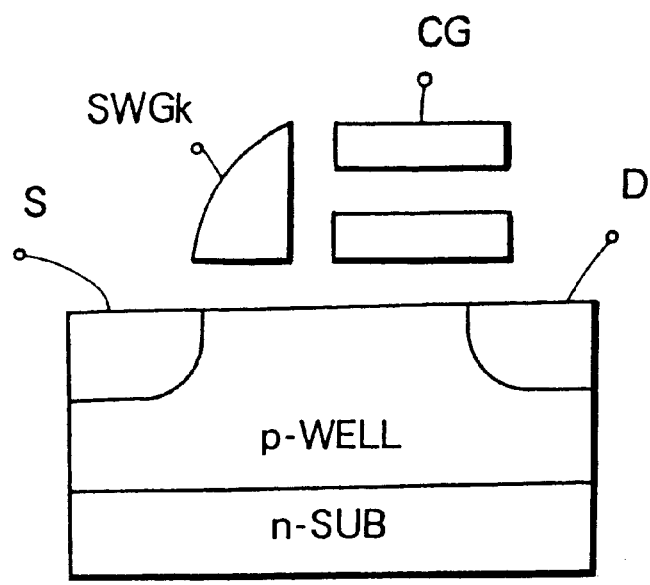
Figure 25B:
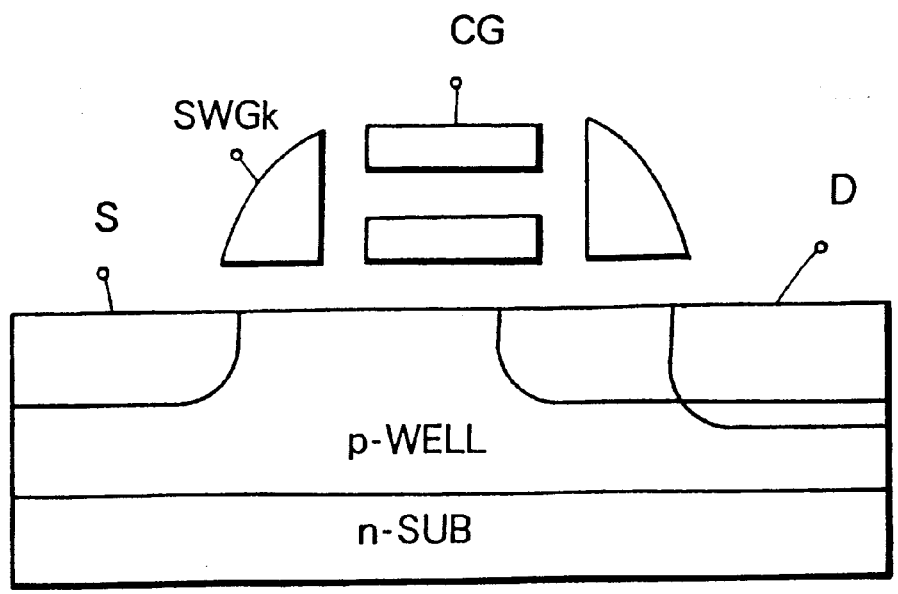

In the present memory cell of the eighth embodiment of the present invention shown in FIG. 24 and FIGS. 25A and 25B, the device is constituted so that a selection gate $SWG_k$ comprising so-called side walls is provided on the source side of the memory transistor M.

An explanation will be made next of a ninth embodiment of the present invention.

Here, a simple explanation will be made of the production method of a selection gate $SWG_k$ comprising the side walls of FIG. 25A using FIGS. 26A to 26H.

Figure 26A:
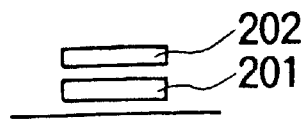
FIGS. 26A to 26H are views for explaining the production process of a selection gate comprised of side walls of a 10th embodiment of the present invention.

First, as shown in FIG. 26A, a so-called stack gate construction comprising the floating gate 201 and control gate 202 is formed by the customary method.

Figure 26B:
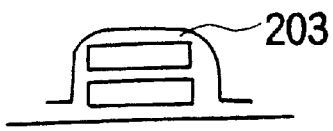
Figure 26C:

Next, as shown in FIG. 26B, an insulation film 203 is formed by thermal oxidation and the chemical vapor deposition (CVD) method, then, as shown in FIG. 26C, etching is selectively carried out, the insulation film on the control gate 202 is removed, and the insulation side wall 203a is formed only on the side of the floating gate 201 and the control gate 202.

Figure 26D:
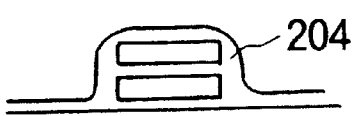
Figure 26E:
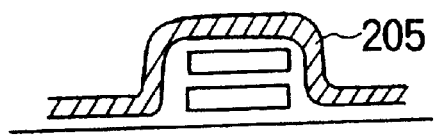

Next, as shown in FIGS. 26D and 26E, a gate insulation film 204 is deposited thereon, and then the polycrystalline silicon 205 is deposited.

Figure 26F:
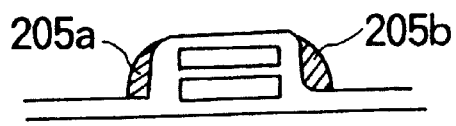

Thereafter, as shown in FIG. 26F, etching is selectively carried out, so that the polycrystalline silicon on the control gate 202 is removed, and the side walls 205a and 205b are formed only on the side of the floating gate 201 and the control gate 202.

Figure 26G:
Figure 26H:
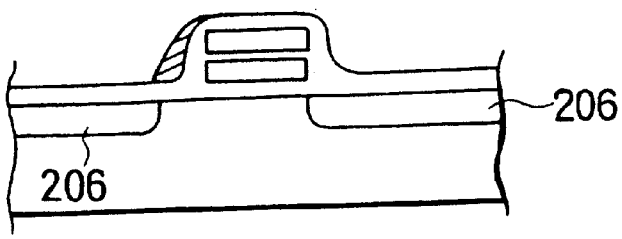

Next, as shown in FIG. 26G, a resist is formed, then the side wall 205b on one side is removed by etching.

Thereafter, the $n^+$ diffusion layer 206 for the source and drain of the memory cell is formed by the usual ion implantation.

After the above manufacturing steps, a memory cell having a selection gate comprising the side walls on the source side is produced.

An explanation will be made next of the reason why provision is made of the selection gate $SWG_k$ comprising the side walls on the source side referring to the memory cell of FIG. 27, not having the selection gate $SWG_k$ comprising the side walls, and FIG. 28, indicating the voltage settings of the lines at the time of reading, erasing, and writing operations of the circuit of FIG. 24 and the transition state of the memories.

Where FN tunneling phenomenon is utilized for writing, since this tunneling phenomenon takes a long time, the writing operation is carried out at one time in the cells connected to one word line WL.

Figure 27:
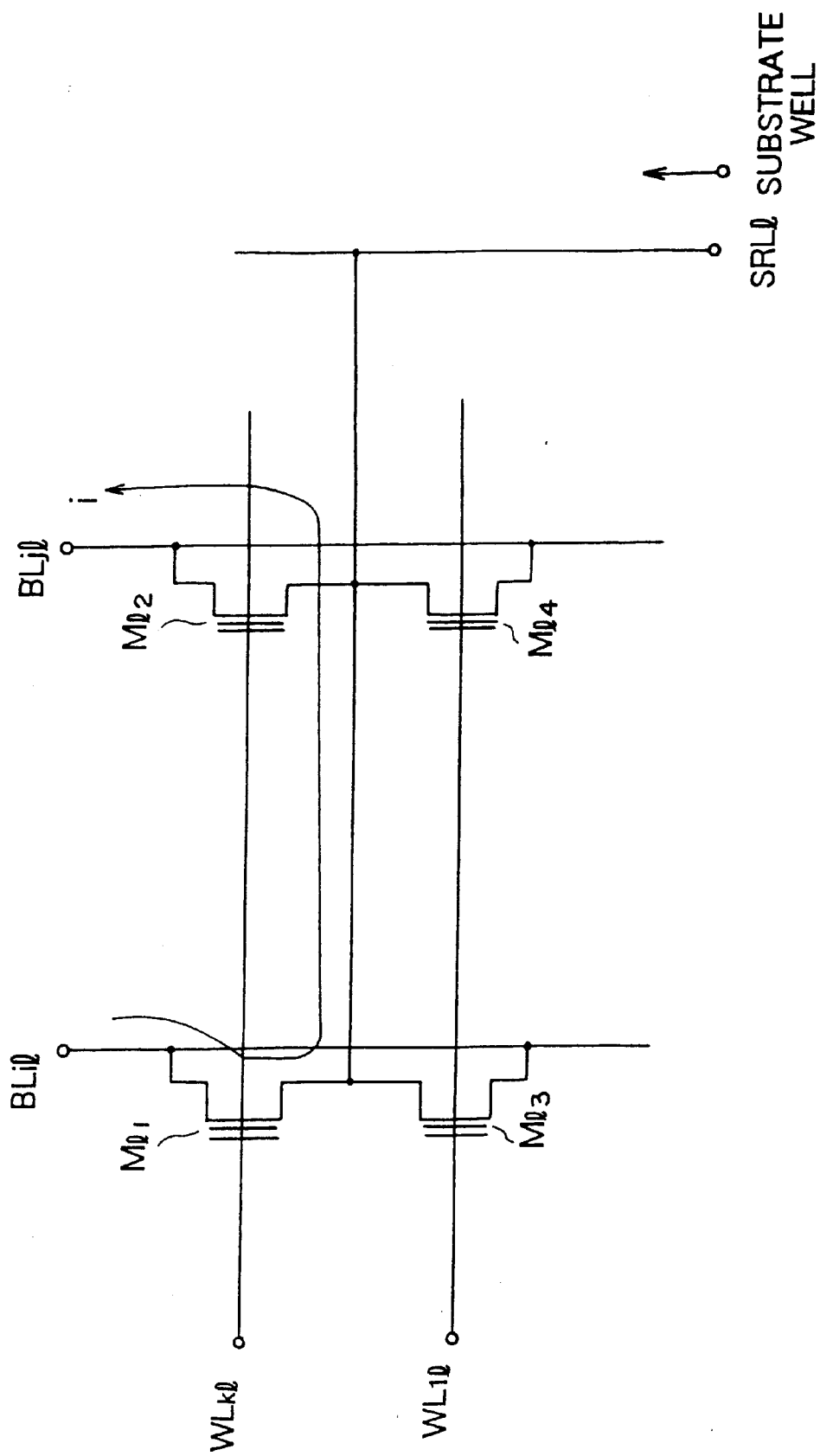
FIG. 27 is a circuit diagram of a memory cell not having a selection gate comprised of side walls.

Now assume that, in FIG. 27, the word line $WL_{11}$ is selected, the data is written in the memory transistor $M_3$ (bit line $BL_{i1}$=5V), and writing is not carried out for the memory transistor $M_4$ (bit line $BL_{j1}$=0V).

At this time, it is necessary that the word line WLkl not be selected, writing of data not be carried out for either of the memory transistors $M_{11}$ and $M_{12}$, and a Vth shift not be manifested.

However, when the word line $WL_{k1}$ is brought to 0V, the memory transistor $M_{11}$ manifests the Vth shift by 100 to 1000 writing operations.

When the word line $WL_{k1}$ is set to 5V so as to prevent this, a leak current flows as indicated by a solid arrow in FIG. 27.

Contrary to this, in the circuit of FIG. 24 providing the selection gate $SWG_k$ comprising the side walls on the source side, as shown in FIG. 28, by setting the selection signal line $SG1_k$ to the non-selection side selection gate $SWG_k$ to 0V, the current path can be cut.

Accordingly, even if the word line $WL1_1$, is set to 4V (or 5V) so as to prevent the manifestation of the Vth shift, a leak current indicated by a broken arrow in FIG. 24 will not flow.

In this way, by providing the selection gate $SWG_1$ comprising the side walls on the source side, the leak current can be effectively prevented.

Note that, the explanation of FIG. 24 indicates a case where the memory transistor $M_{k1}$ is selected, and FIG. 27 indicates a case where the memory transistor $M_{13}$ is selected.

As explained above, according to the memory cell of FIG. 24, the leak current can be effectively prevented, FN tunneling phenomenon can be utilized for the writing and erasing without an increase of the cell size, and a high speed writing/erasing operation can be realized.

Also, a sector of a small size, for example, 4 k bytes or less, can be easily realized, and both of the writing and erasing operations can be effected by the FN tunneling phenomenon, and therefore the realization of a low voltage and single power source is easy.

As explained above, according to the present invention, the writing and erasing of data can be carried out well by the FN tunneling phenomenon, and therefore not only can a reduction of the voltage be achieved, but also a reduction of the number of masks and reduction of manufacturing steps at the time of production can be achieved and no difficult technology is introduced, so the costs are low. The sub-bit lines can be constituted not by the 3-POLY having a high resistance, but by aluminum with its low resistance, and therefore there are advantages in that an improvement of speed can be achieved, for example, the reduction of the accessing time.

Also, by providing a means for holding the non-selected sub-bit line at the reference potential, it is possible to prevent the non-selected sub-bit line from entering the floating state, so it is possible to suppress unintended writing of data.

Moreover, by providing the selection gate on the source side of the memory transistor, the leak current can be effectively prevented, and it is possible to utilize the FN tunneling phenomenon for writing and erasing without an increase of the cell size and to realize a high speed of writing and erasing.

Also, a sector of a small size can be easily realized, and since both of the writing and erasing are performed by the FN tunneling phenomenon, the realization of a single power source of low voltage is easy.

Also, according to the present invention, by applying the writing pulses to the bit lines at the time of writing while shifting the same at predetermined intervals, the drain-substrate current can be greatly reduced while suppressing the increase of the writing time to the minimum level.

As a result, it becomes possible to operate the memory device by a single power source without the limitation by the capability of the booster circuit.

Also, according to the decoder circuit of the present invention, the reading sub-decoder for which the high speed operation is required and the writing/erasing sub-decoder for which the high speed operation is not required in comparison with the reading are separately provided, and therefore an improvement of speed can be achieved.

Many widely different embodiments of the present invention may be constructed without departing from the spirit and scope the present invention, and it should be understood that the present invention is not restricted to the specific embodiment described above.

What is claimed is:

1. A semiconductor non-volatile memory device comprising:
    a main bit line;
    a pair of sub-bit lines connected to drain electrodes of a respective plurality of memory transistors, the pair of sub-bit lines arranged as adjacent columns in parallel with respect to said main bit line; and
    a pair of selection gates provided between said main bit line and said pair of sub-bit lines respectively and in use selectively connecting one of said pair of sub-bit lines to said main bit line wherein each of said respective plurality of memory transistors are arranged to have drain electrodes connected with one of said pair of sub-bit lines via contact holes and source electrodes of said memory transistors are connected with a common array source.

2. The semiconductor non-volatile memory device of claim 1, further comprising a means for holding a non-selected sub-bit line of said pair of sub-bit lines at a reference potential.

3. The semiconductor non-volatile memory device as set forth in claim 1, wherein each of said pair of selection gates comprises two cascade-connected gates including a depletion type transistor.

4. A semiconductor non-volatile memory block comprising:
    a main bit line;
    a pair of sub-bit lines connected to drain electrodes of a plurality of memory transistors and the pair of sub-bit lines arranged as adjacent columns in parallel with respect to said main bit line;

a first pair of selection gates provided between said main bit line and said pair of sub-bit lines respectively and in use selectively connecting one of said pair of sub-bit lines to said main bit line;

a second pair of selection gates connected between the sub-bit lines and a common array source and in use selectively connected a sub-bit line which is not connected to the main bit line to said common array source; and wherein each of said respective plurality of memory transistors are arranged so that said drain electrodes are connected with one of said pair of sub-bit lines and source electrodes are connected with a common array source.

5. A semiconductor non-volatile memory device as set forth in claim 2, wherein each of said pair of selection gates and said means for holding the non-selected sub-bit lines both comprise two cascade connected gates including a depletion type transistor.

* * * * *